United States Patent
Fiolka et al.

(10) Patent No.: US 9,316,772 B2
(45) Date of Patent: Apr. 19, 2016

(54) PRODUCING POLARIZATION-MODULATING OPTICAL ELEMENT FOR MICROLITHOGRAPHY SYSTEM

(71) Applicant: Carl Zeiss SMT GmbH, Oberkochen (DE)

(72) Inventors: Damian Fiolka, Oberkochen (DE); Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 152 days.

(21) Appl. No.: 14/108,428

(22) Filed: Dec. 17, 2013

(65) Prior Publication Data

US 2014/0102355 A1  Apr. 17, 2014

Related U.S. Application Data

(63) Continuation of application No. 13/800,607, filed on Mar. 13, 2013, now Pat. No. 8,711,479, which is a continuation of application No. 12/200,068, filed on Aug. 28, 2008, now Pat. No. 8,861,084, which is a (Continued)

(51) Int. Cl.
*G02B 5/30* (2006.01)
*G02B 27/28* (2006.01)
(Continued)

(52) U.S. Cl.
CPC ............ *G02B 5/3083* (2013.01); *G02B 1/08* (2013.01); *G02B 5/3025* (2013.01);
(Continued)

(58) Field of Classification Search
CPC .... G02B 5/3083; G02B 5/3025; G02B 27/26; G02B 27/286; G02B 27/28; G02B 5/32; G02B 1/08; G02B 6/00; G02B 6/126; G06F 1/133528; G06F 1/13363; G06F 2001/133631; G06F 2001/133638; G06F 2001/13354
USPC ............................ 359/486.01, 486.03, 492.01
See application file for complete search history.

(56) References Cited

U.S. PATENT DOCUMENTS

| | | | |
|---|---|---|---|
| 2,473,857 | A | 6/1949 | Burchell |
| 3,438,692 | A | 4/1969 | Tabor |

(Continued)

FOREIGN PATENT DOCUMENTS

| | | |
|---|---|---|
| CN | 1270326 A | 10/2000 |
| DE | 28 05 732 A1 | 8/1978 |
| DE | 195 20 563 | 12/1996 |
| DE | 195 29 563 | 2/1997 |
| DE | 196 21 512 | 12/1997 |

(Continued)

OTHER PUBLICATIONS

Bruner, et al., "High NA Lithographic Imaging at Brewster's Angle," SPIE (USA), vol. 4691, pp. 1-24, 2002.

(Continued)

*Primary Examiner* — Jade R Chwasz
(74) *Attorney, Agent, or Firm* — Fish & Richardson P.C.

(57) ABSTRACT

Methods of producing a polarization-modulating element that modulates a polarization state of incident light into a predetermined polarization state, the polarization-modulating element being used with an illumination optical apparatus, include preparing an optical material having optical activity, and providing the optical material with a circumferentially varying thickness profile and a central region that is an aperture having no optical activity. The thickness profile is set so that light in a linearly polarized state having a direction of polarization substantially along a single direction, is transformed into light in an azimuthal polarization state having a direction of polarization substantially along a circumferential direction or into light in a radially polarized state having a direction of polarization substantially along the radial direction.

15 Claims, 9 Drawing Sheets

Related U.S. Application Data continuation of application No. 10/580,698, filed as application No. PCT/EP2005/000320 on Jan. 14, 2005, now Pat. No. 8,279,524.

(60) Provisional application No. 60/537,327, filed on Jan. 16, 2004.

(51) Int. Cl.
  *G02B 1/08* (2006.01)
  *G02F 1/01* (2006.01)
  *G03F 7/20* (2006.01)

(52) U.S. Cl.
  CPC ........... *G02B 5/3075* (2013.01); *G02B 27/286* (2013.01); *G02F 1/0136* (2013.01); *G03F 7/70058* (2013.01); *G03F 7/70341* (2013.01); *G03F 7/70566* (2013.01); *G02F 1/0147* (2013.01)

(56) References Cited

U.S. PATENT DOCUMENTS

| | | |
|---|---|---|
| 3,484,714 A | 12/1969 | Koester et al. |
| 3,630,598 A | 12/1971 | Little, Jr. |
| 3,719,415 A | 3/1973 | Rawson |
| 3,758,201 A | 9/1973 | MacNeille |
| 3,892,469 A | 7/1975 | Lotspeich |
| 3,892,470 A | 7/1975 | Lotspeich |
| 3,957,375 A | 5/1976 | Hadeishi |
| 4,175,830 A | 11/1979 | Marié |
| 4,235,517 A | 11/1980 | Marie |
| 4,272,158 A | 6/1981 | Johnston, Jr. et al. |
| 4,286,843 A | 9/1981 | Reytblatt |
| 4,370,026 A | 1/1983 | Dubroeucq et al. |
| 4,712,880 A | 12/1987 | Shirasaki |
| 4,744,615 A | 5/1988 | Fan et al. |
| 4,755,027 A | 7/1988 | Schaefer |
| 5,253,110 A | 10/1993 | Ichihara et al. |
| 5,300,972 A | 4/1994 | Kamon |
| 5,345,292 A | 9/1994 | Shiozawa et al. |
| 5,365,371 A | 11/1994 | Kamon |
| 5,382,999 A | 1/1995 | Kamon |
| 5,436,761 A | 7/1995 | Kamon |
| 5,442,184 A | 8/1995 | Palmer et al. |
| 5,453,814 A | 9/1995 | Aiyer |
| 5,459,000 A | 10/1995 | Unno |
| 5,471,343 A | 11/1995 | Takasugi |
| 5,475,491 A | 12/1995 | Shiozawa |
| 5,541,026 A | 7/1996 | Matsumoto |
| 5,557,692 A | 9/1996 | Pan et al. |
| 5,559,583 A | 9/1996 | Tanabe |
| 5,621,498 A | 4/1997 | Inoue et al. |
| 5,627,626 A | 5/1997 | Inoue et al. |
| 5,663,785 A | 9/1997 | Kirk et al. |
| 5,673,103 A | 9/1997 | Inoue et al. |
| 5,677,755 A | 10/1997 | Oshida et al. |
| 5,692,082 A | 11/1997 | Fukushima |
| 5,707,501 A | 1/1998 | Inoue et al. |
| 5,719,704 A | 2/1998 | Shiraishi et al. |
| 5,739,898 A | 4/1998 | Ozawa et al. |
| 5,815,247 A | 9/1998 | Poschenrieder et al. |
| 5,841,500 A | 11/1998 | Patel |
| 5,867,315 A | 2/1999 | Koike et al. |
| 5,933,219 A | 8/1999 | Unno |
| 6,031,658 A | 2/2000 | Riza |
| 6,191,880 B1 | 2/2001 | Schuster |
| 6,211,944 B1 | 4/2001 | Shiraishi |
| 6,229,647 B1 | 5/2001 | Takahashi et al. |
| 6,233,041 B1 | 5/2001 | Shiraishi |
| 6,246,506 B1 | 6/2001 | Kobayashi et al. |
| 6,252,712 B1 | 6/2001 | Fuerter et al. |
| 6,258,433 B1 | 7/2001 | Okuda et al. |
| 6,259,512 B1 | 7/2001 | Mizouchi |
| 6,285,443 B1 | 9/2001 | Wangler et al. |
| 6,310,679 B1 | 10/2001 | Shiraishi |
| 6,320,699 B1 | 11/2001 | Maeda et al. |
| 6,324,203 B1 | 11/2001 | Owa |
| 6,361,909 B1 | 3/2002 | Gau et al. |
| 6,392,800 B2 | 5/2002 | Schuster |
| 6,404,482 B1 | 6/2002 | Shiraishi |
| 6,452,662 B2 | 9/2002 | Mulkens et al. |
| 6,483,573 B1 | 11/2002 | Schuster |
| 6,535,273 B1 | 3/2003 | Maul |
| 6,538,247 B2 | 3/2003 | Iizuka |
| 6,553,156 B1 | 4/2003 | Li |
| 6,583,931 B2 | 6/2003 | Hiraiwa et al. |
| 6,636,295 B2 | 10/2003 | Shiozawa |
| 6,661,484 B1 | 12/2003 | Iwai et al. |
| 6,661,499 B2 | 12/2003 | Omura et al. |
| 6,721,258 B1 | 4/2004 | Hashimoto |
| 6,769,273 B1 | 8/2004 | Nakagawa et al. |
| 6,774,984 B2 | 8/2004 | Gerhard |
| 6,842,223 B2 | 1/2005 | Tyminski |
| 6,856,379 B2 | 2/2005 | Schuster |
| 6,885,502 B2 | 4/2005 | Schuster |
| 6,913,373 B2 | 7/2005 | Tanaka et al. |
| 6,934,009 B2 | 8/2005 | Terashi |
| 6,943,941 B2 | 9/2005 | Flagello et al. |
| 6,965,484 B2 | 11/2005 | Shaver |
| 6,970,233 B2 | 11/2005 | Blatchford |
| 7,009,686 B2 | 3/2006 | Kawashima et al. |
| 7,038,763 B2 | 5/2006 | Mulder et al. |
| 7,113,260 B2 | 9/2006 | Schuster et al. |
| 7,126,667 B2 | 10/2006 | Kawashima et al. |
| 7,126,673 B2 | 10/2006 | Mori |
| 7,145,720 B2 | 12/2006 | Krahmer et al. |
| 7,170,679 B2 | 1/2007 | Bievenour et al. |
| 7,199,864 B2 | 4/2007 | Gerhard |
| 7,199,936 B2 | 4/2007 | Williams et al. |
| 7,209,289 B2 | 4/2007 | Giordano |
| 7,239,375 B2 | 7/2007 | Tsuji |
| 7,265,816 B2 | 9/2007 | Tsuji |
| 7,292,315 B2 | 11/2007 | Socha et al. |
| 7,304,719 B2 | 12/2007 | Albert et al. |
| 7,345,740 B2 | 3/2008 | Wagner et al. |
| 7,345,741 B2 | 3/2008 | Shiozawa et al. |
| 7,375,887 B2 | 5/2008 | Hansen et al. |
| 7,386,830 B2 | 6/2008 | Fukuhara |
| 7,408,616 B2 | 8/2008 | Gruner et al. |
| 7,408,622 B2 | 8/2008 | Fiolka et al. |
| 7,411,656 B2 | 8/2008 | Totzeck et al. |
| 7,414,786 B2 | 8/2008 | Brown et al. |
| 7,433,046 B2 | 10/2008 | Everett et al. |
| 7,436,491 B2 | 10/2008 | Fukuhara |
| 7,445,883 B2 | 11/2008 | Baba-Ali et al. |
| 7,446,858 B2 | 11/2008 | Kudo et al. |
| 7,499,148 B2 | 3/2009 | Yamada et al. |
| 7,511,884 B2 | 3/2009 | Flagello et al. |
| 7,515,248 B2 | 4/2009 | Tanitsu et al. |
| 2001/0012154 A1 | 8/2001 | Schuster |
| 2001/0019404 A1 | 9/2001 | Schuster et al. |
| 2002/0024008 A1 | 2/2002 | Iizuka |
| 2002/0085176 A1 | 7/2002 | Hiraiwa et al. |
| 2002/0085276 A1 | 7/2002 | Tanitsu et al. |
| 2002/0126380 A1 | 9/2002 | Schuster |
| 2002/0149847 A1 | 10/2002 | Osawa et al. |
| 2002/0152452 A1 | 10/2002 | Socha |
| 2002/0163629 A1 | 11/2002 | Switkes et al. |
| 2002/0176166 A1 | 11/2002 | Schuster |
| 2002/0177048 A1 | 11/2002 | Saitoh et al. |
| 2002/0177054 A1 | 11/2002 | Saitoh et al. |
| 2002/0186462 A1 | 12/2002 | Gerhard |
| 2002/0191288 A1 | 12/2002 | Gruner et al. |
| 2002/0196416 A1 | 12/2002 | Shiraishi |
| 2002/0196629 A1 | 12/2002 | Terashi |
| 2003/0007158 A1 | 1/2003 | Hill |
| 2003/0038225 A1 | 2/2003 | Mulder et al. |
| 2003/0053036 A1 | 3/2003 | Fujishima et al. |
| 2003/0067591 A1 | 4/2003 | Komatsuda |
| 2003/0086070 A1 | 5/2003 | Goo et al. |
| 2003/0095241 A1 | 5/2003 | Burghoorn |
| 2003/0160949 A1 | 8/2003 | Komatsuda et al. |
| 2003/0234348 A1 | 12/2003 | Takeuchi et al. |

(56) References Cited

U.S. PATENT DOCUMENTS

| | | |
|---|---|---|
| 2004/0012764 A1 | 1/2004 | Mulder et al. |
| 2004/0169924 A1 | 9/2004 | Flagello et al. |
| 2004/0184019 A1 | 9/2004 | Totzeck et al. |
| 2004/0240073 A1 | 12/2004 | Gerhard |
| 2005/0164522 A1 | 7/2005 | Kunz et al. |
| 2005/0195480 A1 | 9/2005 | Brown et al. |
| 2005/0219696 A1 | 10/2005 | Albert et al. |
| 2005/0237527 A1 | 10/2005 | Mori |
| 2005/0264885 A1 | 12/2005 | Albert |
| 2005/0286038 A1 | 12/2005 | Albert et al. |
| 2006/0055834 A1 | 3/2006 | Tanitsu et al. |
| 2006/0072095 A1 | 4/2006 | Kudo et al. |
| 2006/0077370 A1 | 4/2006 | Mulkens et al. |
| 2006/0092398 A1 | 5/2006 | McCarthy |
| 2006/0119826 A1 | 6/2006 | Gerhard |
| 2006/0139611 A1 | 6/2006 | Wagner et al. |
| 2006/0146384 A1 | 7/2006 | Schultz et al. |
| 2006/0158624 A1 | 7/2006 | Toyoda |
| 2006/0170901 A1 | 8/2006 | Tanitsu et al. |
| 2006/0203214 A1 | 9/2006 | Shiraishi |
| 2006/0221453 A1 | 10/2006 | Koehler et al. |
| 2006/0291057 A1 | 12/2006 | Fiolka et al. |
| 2007/0008511 A1 | 1/2007 | DeBoeij et al. |
| 2007/0019179 A1 | 1/2007 | Fiolka et al. |
| 2007/0058151 A1 | 3/2007 | Eurlings et al. |
| 2007/0081114 A1 | 4/2007 | Fiolka et al. |
| 2007/0139636 A1 | 6/2007 | Gerhard |
| 2007/0146676 A1 | 6/2007 | Tanitsu et al. |
| 2007/0222962 A1 | 9/2007 | Kudo |
| 2007/0296941 A1 | 12/2007 | Omura |
| 2008/0024747 A1 | 1/2008 | Kudo et al. |
| 2008/0068572 A1 | 3/2008 | Kudo et al. |
| 2008/0130109 A1 | 6/2008 | Albert et al. |
| 2008/0316459 A1 | 12/2008 | Fiolka et al. |
| 2008/0316598 A1 | 12/2008 | Fiolka et al. |
| 2009/0002675 A1 | 1/2009 | Fiolka et al. |
| 2009/0073414 A1 | 3/2009 | Tanitsu et al. |
| 2009/0073441 A1 | 3/2009 | Tanitsu et al. |
| 2009/0115989 A1 | 5/2009 | Tanaka |
| 2009/0122292 A1 | 5/2009 | Shiraishi |
| 2009/0128796 A1 | 5/2009 | Tanaka |
| 2009/0147233 A1 | 6/2009 | Toyoda |
| 2009/0147234 A1 | 6/2009 | Toyoda |
| 2009/0147235 A1 | 6/2009 | Toyoda |
| 2009/0185156 A1 | 7/2009 | Kudo et al. |
| 2009/0275420 A1 | 11/2009 | Tanaka |
| 2009/0284729 A1 | 11/2009 | Shiraishi |
| 2009/0296066 A1 | 12/2009 | Fiolka |
| 2009/0316132 A1 | 12/2009 | Tanitsu et al. |
| 2009/0323041 A1 | 12/2009 | Toyoda |
| 2010/0045957 A1 | 2/2010 | Fiolka et al. |
| 2010/0141921 A1 | 6/2010 | Omura |
| 2010/0141926 A1 | 6/2010 | Omura |
| 2010/0142051 A1 | 6/2010 | Omura |
| 2010/0177293 A1 | 7/2010 | Fiolka et al. |

FOREIGN PATENT DOCUMENTS

| | | | |
|---|---|---|---|
| DE | 198 07 120 | 8/1999 | |
| EP | 0 230 931 A2 | 8/1987 | |
| EP | 0 486 316 | 5/1992 | ............... G03F 7/20 |
| EP | 0 764 858 | 8/1996 | |
| EP | 0 744 664 | 11/1996 | |
| EP | 08 23662 | 2/1998 | |
| EP | 1 014 196 A2 | 6/2000 | |
| EP | 1 045 272 A2 | 10/2000 | |
| EP | 1 069 600 A1 | 1/2001 | |
| EP | 1 367 446 A1 | 12/2003 | |
| EP | 1260849 | 12/2004 | |
| EP | 1693885 A1 | 8/2006 | |
| EP | 1 720 199 | 11/2006 | |
| GB | 856621 | 12/1960 | |
| JP | 61-91662 | 5/1986 | |
| JP | 62-265722 | 11/1987 | |
| JP | 63-044726 | 2/1988 | |
| JP | 4-101148 | 4/1992 | |
| JP | 4-225357 | 8/1992 | |
| JP | 5-090128 | 4/1993 | |
| JP | 5-109601 | 4/1993 | |
| JP | 5-283317 | 10/1993 | |
| JP | 5-326370 | 12/1993 | |
| JP | 6-053120 | 2/1994 | |
| JP | 6-118623 | 4/1994 | |
| JP | H 06-120110 | 4/1994 | ............ H01L 21/027 |
| JP | 6-124873 | 5/1994 | |
| JP | 6-140306 | 5/1994 | |
| JP | 6-188169 | 7/1994 | |
| JP | 6-196388 | 7/1994 | |
| JP | 6-204121 | 7/1994 | |
| JP | 7-142338 | 6/1995 | |
| JP | 7-183201 | 7/1995 | |
| JP | 7-201723 | 8/1995 | |
| JP | 7-283119 | 10/1995 | |
| JP | 7-307268 | 11/1995 | |
| JP | 9-043401 | 2/1997 | |
| JP | 9-120154 | 5/1997 | |
| JP | 9-184918 | 7/1997 | |
| JP | 9-219358 | 8/1997 | |
| JP | 10-079337 | 3/1998 | |
| JP | 10-104427 | 4/1998 | |
| JP | 10-303114 | 11/1998 | |
| JP | 11-54426 | 2/1999 | |
| JP | 2000-31047 | 1/2000 | ............ H01L 21/027 |
| JP | 2000-114157 | 4/2000 | |
| JP | 2000-235725 | 8/2000 | ............. G11B 7/135 |
| JP | 2001-135560 | 5/2001 | |
| JP | 2001-274083 | 10/2001 | |
| JP | 2001-284228 | 10/2001 | |
| JP | B2 3246615 | 11/2001 | |
| JP | 3246615 B2 | 1/2002 | |
| JP | 2002-075816 | 3/2002 | |
| JP | 2002-075835 | 3/2002 | |
| JP | 2002-231619 | 8/2002 | |
| JP | 2002-324743 | 11/2002 | |
| JP | 2002 334836 | 11/2002 | |
| JP | 2003-035822 | 2/2003 | |
| JP | 2003-059821 | 2/2003 | |
| JP | 2003 297727 | 10/2003 | |
| JP | 2004-179172 | 6/2004 | |
| JP | 2005-108925 | 4/2005 | |
| JP | 2005-166871 | 6/2005 | |
| KR | 2000-0076783 | 12/2000 | |
| WO | WO 99/49504 | 9/1999 | |
| WO | WO 00/02092 | 1/2000 | |
| WO | WO 00/67303 | 11/2000 | |
| WO | WO 00/79331 | 12/2000 | |
| WO | WO 01/51981 A1 | 7/2001 | |
| WO | WO 02/27402 | 4/2002 | ................ G03F 1/00 |
| WO | WO 02/082169 | 10/2002 | |
| WO | WO 02/093209 | 11/2002 | |
| WO | WO 03/067334 A2 | 8/2003 | |
| WO | WO 03/076978 A2 | 9/2003 | |
| WO | WO 2004/051717 | 6/2004 | |
| WO | WO 2004/102273 | 11/2004 | |
| WO | WO 2005/026822 | 3/2005 | |
| WO | WO 2005/027207 | 3/2005 | |
| WO | WO 2005/031467 | 4/2005 | |
| WO | WO 2005/036619 | 4/2005 | |
| WO | WO 2005/041277 | 5/2005 | |
| WO | WO 2005/050718 | 6/2005 | |
| WO | WO 2005/059645 | 6/2005 | |
| WO | WO 2005/059653 A2 | 6/2005 | |
| WO | WO 2005/069081 | 7/2005 | |
| WO | WO 2005/076045 | 8/2005 | |
| WO | WO 2005/116772 | 12/2005 | |
| WO | WO 2006/021288 | 3/2006 | |
| WO | WO 2006/059549 | 6/2006 | |
| WO | WO 2006/077849 | 7/2006 | |
| WO | WO 2007/039519 | 4/2007 | |

OTHER PUBLICATIONS

Hecht, Eugene, Optics, 2002, Pearson Education, Inc., Fourth Edition, 348-349.

(56) References Cited

OTHER PUBLICATIONS

Hecht, Eugene, Optics, 2002, Pearson Education, Inc., Fourth Edition, 360, 366-367.
Hecht, Optics, Pearson Education Inc. Fourth Edition, 342-343, 2002.
Hecht, Optics, Pearson Education Inc. Fourth Edition, 352-355, 2002.
Himel et al., "Design and fabrication of customized illumination patterns for low ki lithography: a diffractive approach," Optical Microlithography XIV, Christopher J. Progler, Editor, Proceedings of SPIE vol. 4346 (2001).
Chinese Office Action with English translation, for the corresponding Chinese Application No. 200580002241.9, filed Jan. 14, 2005, dated Apr. 10, 2009.
Chinese Office Action, with English translation, for the corresponding Chinese Application No. 2010-10155323.X, dated Jan. 20, 2011.
Chinese Office Action, with English translation, for the corresponding Chinese Application No. 2010-10155325.9, dated Jan. 25, 2011.
Chinese Office Action with English translation, for the corresponding Chinese Application No. 2010-10155335.2, dated Mar. 17, 2011.
EP office action for the corresponding EP Application No. 05 706 888.4 dated Aug. 19, 2010.
International Preliminary Report on Patentability for International Application No. PCT/EP05/050981, dated Nov. 29, 2006.
International Search Report for International Application No. PCT/EP05/050981, dated Jul. 28, 2005.
Japanese Office Action with English translation for Application No. 2006-548272, issued Sep. 27, 2010.
Fused quartz, http://en.wikipedia.org/wiki/Fused_quartz, Aug. 27, 2009.
Shafer et al. v. Omura, "Judgment_Request for Adverse_Bd.R. 127(b)," for Patent Interference No. 105,678 (SCM), filed Aug. 31, 2009 with the United States Patent and Trademark Office before the Board of Patent Appeals and Interferences (3 pages).
Shafer et al. v. Omura, "Shafer Motions List," for Patent Interference No. 105,678 (SCM), filed Mar. 25, 2009 with the United States Patent and Trademark Office before the Board of Patent Appeals and Interferences (13 pages).
Smith et al., "Benefiting from polarization_effects on high-NA imaging," Optical Microlithography XVII, Proc. of SPIE vol. 5377, Bellingham, WA, 2004, pp. 68-79.
Japanese Office Action, with English translation, for JP Application No. 2006-548272, issued Jul. 4, 2011.
Korean Office Action, with English translation, for corresponding KR Appl No. 10-2006-7010502, dated Jul. 20, 2011.
Chinese Office Action with English translation, for the corresponding Chinese Application No. 200910253785.2, dated Jul. 20, 2011.
Chinese Office Action with English translation, for the corresponding Chinese Application No. 201010155325.9, dated Oct. 17, 2011.
Chinese Office Action with English translation, for the corresponding Chinese Application No. 201010155323.X, dated Dec. 31, 2011.
Applied Optics II, Baifukan Co., Ltd., pp. 166-167, Jul. 1990.
Korean Office Action with English translation, for the corresponding KR Application No. 10-2011-7024708, dated Oct. 19, 2012.
Korean Office Action with English translation, for the corresponding KR Application No. 10-2012-7001214, dated Nov. 20, 2012.
Japanese Office Action, with English translation, for corresponding JP Application No. 2011-069962, dated Jan. 7, 2013.
Japanese Office Action, with English translation, for JP Application 2011-69959, dated Jan. 7, 2013.
Japanese Office Action, with English translation, for JP Application 2011-69960, dated Jan. 7, 2013.
Chinese Office Action with English translation, dated May 9, 2008, for the corresponding Chinese Application No. 200580002241.9, filed Jan. 14, 2005.
Chinese Office Action with English translation, dated Dec. 5, 2008, for the corresponding Chinese Application No. 200580002241.9, filed Jan. 14, 2005.
EP office action, dated Mar. 3, 2008, for the corresponding EP Application No. 05 706 888.4.
The International Preliminary Report on Patentability for the corresponding PCT application PCT/EP2005/000320, filed Jan. 14, 2005.
Japanese Office Action with English translation, dated Sep. 30, 2013, for the corresponding JP Application No. P2011-069960.
Japanese Office Action "Notification of Ground(s) for Refusal", for Japanese Patent Application No. JP2014-034265 dated Jan. 5, 2015 (8 pages).
Decision of Final Rejection for Japanese Patent Application No. P2014-034265 dated Jun. 29, 2015 (6 pages).
Japanese Office Action for Japanese Application No. JP 2015-077668 by Examiner Ryoji GOTO dated Feb. 24, 2016 (4 pages).
Japanese Office Action for Japanese Application No. P 2014-034265 by Japanese Examiner Kazunori Ijima dated Jan. 26, 2016 (7 pages).

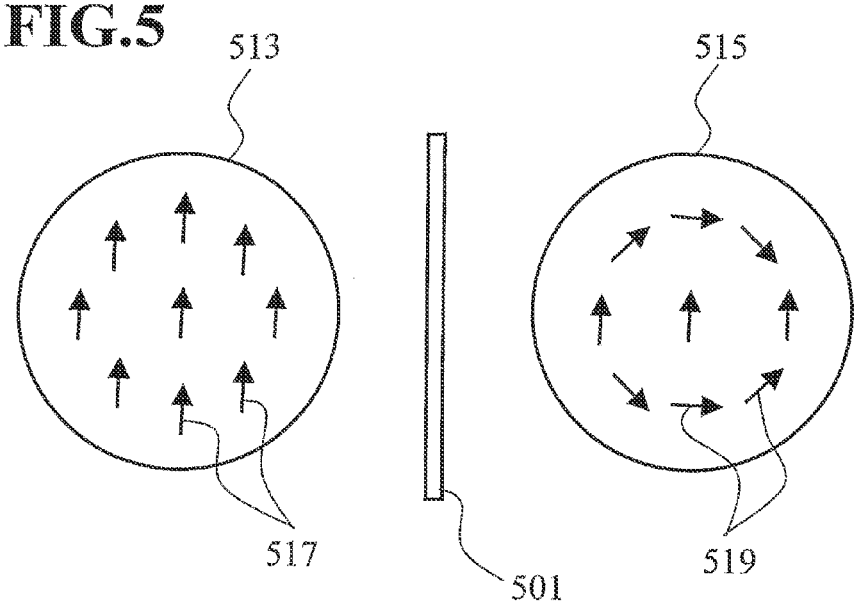
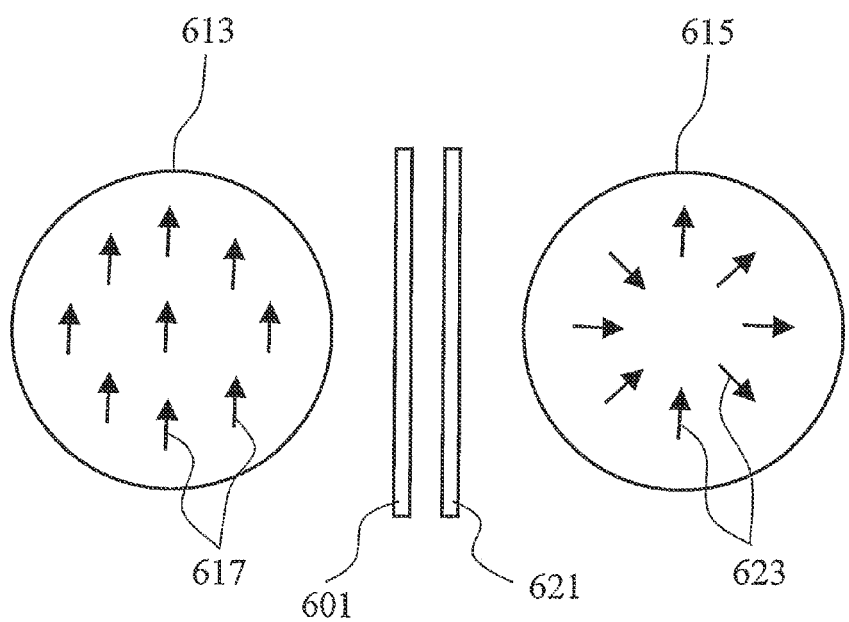

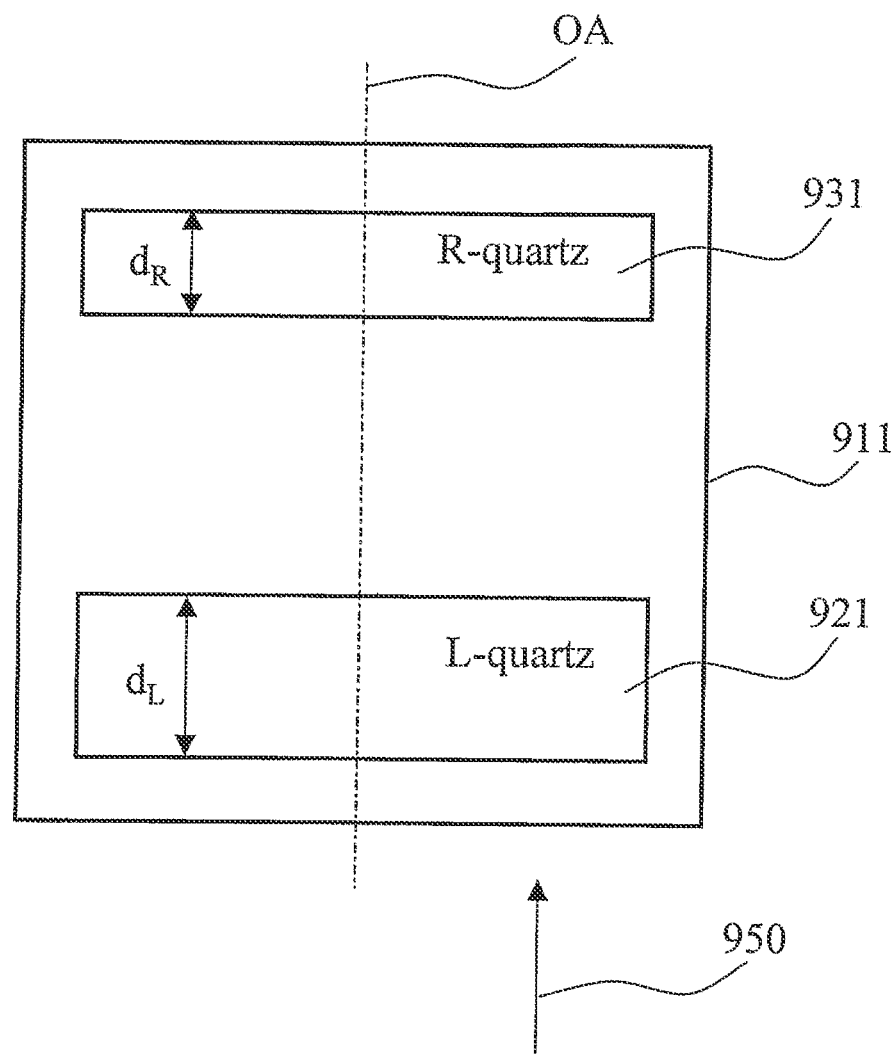

PRODUCING POLARIZATION-MODULATING OPTICAL ELEMENT FOR MICROLITHOGRAPHY SYSTEM

CROSS REFERENCE TO RELATED APPLICATIONS

This application is a continuation of U.S. application Ser. No. 13/800,607, filed on Mar. 13, 2013, which is a continuation of U.S. application Ser. No. 12/200,068, filed on Aug. 28, 2008, which is a continuation of U.S. application Ser. No. 10/580,698, filed on Nov. 29, 2006, now U.S. Pat. No. 8,279,524, which is a national phase application under 35 U.S.C. Section 371 filed from International Patent Application PCT/EP2005/000320, filed Jan. 14, 2005, which claims priority to U.S. Ser. No. 60/537,327, filed Jan. 16, 2004. The contents of these applications are incorporated herein by reference in their entirety.

BACKGROUND OF THE INVENTION

The invention relates to an optical element that affects the polarization of light rays. The optical element has a thickness profile and consists or comprises of an optically active crystal with an optical axis.

In the continuing effort to achieve structures of finer resolution in the field of microlithography, there is a parallel pursuit of substantially three guiding concepts. The first of these is to provide projection objectives of very high numerical aperture. Second is the constant trend towards shorter wavelengths, for example 248 nm, 193 nm, or 157 nm. Finally, there is the concept of increasing the achievable resolution by introducing an immersion medium of a high refractive index into the space between the last optical element of the projection objective and the light-sensitive substrate. The latter technique is referred to as immersion lithography.

In an optical system that is illuminated with light of a defined polarization, the s- and p-component of the electrical field vector, in accordance with Fresnel's equations, are subject to respectively different degrees of reflection and refraction at the interface of two media with different refractive indices. In this context and hereinafter, the polarization component that oscillates parallel to the plane of incidence of a light ray is referred to as p-component, while the polarization component that oscillates perpendicular to the plane of incidence of a light ray is referred to as s-component. The different degrees of reflection and refraction that occur in the s-component in comparison to the p-component have a significant detrimental effect on the imaging process.

This problem can be avoided with a special distribution of the polarization where the planes of oscillation of the electrical field vectors of individual linearly polarized light rays in a pupil plane of the optical system have an approximately radial orientation relative to the optical axis. A polarization distribution of this kind will hereinafter be referred to as radial polarization. If a bundle of light rays that are radially polarized in accordance with the foregoing definition meets an interface between two media of different refractive indices in a field plane of an objective, only the p-component of the electrical field vector will be present, so that the aforementioned detrimental effect on the imaging quality is reduced considerably.

In analogy to the foregoing concept, one could also choose a polarization distribution where the planes of oscillation of the electrical field vectors of individual linearly polarized light rays in a pupil plane of the system have an orientation that is perpendicular to the radius originating from the optical axis. A polarization distribution of this type will hereinafter be referred to as tangential polarization. If a bundle of light rays that are tangentially polarized in accordance with this definition meets an interface between two media of different refractive indices, only the s-component of the electrical field vector will be present so that, as in the preceding case, there will be uniformity in the reflection and refraction occurring in a field plane.

Providing an illumination with either tangential or radial polarization in a pupil plane is of high importance in particular when putting the aforementioned concept of immersion lithography into practice, because of the considerable negative effects on the state of polarization that are to be expected based on the differences in the refractive index and the strongly oblique angles of incidence at the respective interfaces from the last optical element of the projection objective to the immersion medium and from the immersion medium to the coated light-sensitive substrate.

U.S. Pat. No. 6,191,880 B1 discloses an optical arrangement for generating an approximately radial polarization. The arrangement includes among other things a raster of half-wave plates whose respective directions of preference are oriented so that when linearly polarized light passes through the raster arrangement, the plane of oscillation is rotated into the direction of a radius originating from the optical axis. However, because the raster arrangement is produced by joining a large number of individually oriented half-wave plates, it is expensive to produce. Furthermore, the change in the direction of the polarization is constant within the area of each individual half-wave plate whose diameter is typically between 10 and 20 mm, so that no continuous radial polarization can be produced through this concept.

A birefringent element of crystalline quartz with an irregularly varying thickness is proposed in DE 198 07 120 A1 for the compensation of local aberrations of a defined state of polarization in an optical system. However, the variation in thickness in a birefringent element of this type leads to locally different states of polarization. In particular, the linear state of polarization is, as a rule, not preserved in an arrangement of this type.

OBJECT OF THE INVENTION

The present invention therefore has the objective to propose a polarization-modulating optical element which—with a minimum loss of intensity—affects the polarization of light rays in such a way that from linearly polarized light with a first distribution of the directions of the oscillation planes of individual light rays, the optical element generates linearly polarized light with a second distribution of the directions of the oscillation planes of individual light rays.

Further objects of the present invention are to propose an optical system with improved properties of the polarization-modulating optical element regarding thermal stability of the second distribution of oscillation planes (polarization distribution), and to minimize the influence of additional optical elements in the optical system to the polarization distribution after the light rays have passed these elements.

SUMMARY OF THE INVENTION

To meet the foregoing objectives, a polarization-modulating optical element is proposed which consists or comprises of an optically active crystal and which, according to the invention, is shaped with a thickness profile that varies in the directions perpendicular to the optical axis. Further, the optical systems as described in claims 57, 64, 65, 70 and 75 meet the objects of the present invention. Additional preferred embodiments of the optical systems according to the present invention are given in the dependent claims.

A polarization-modulating optical element according to the invention has the effect that the plane of oscillation of a first linearly polarized light ray and the plane of oscillation of a second linearly polarized light ray are rotated, respectively, by a first and a second angle of rotation, with the first angle of rotation being different from the second angle of rotation. According to the invention, the polarization-modulating optical element is made of an optically active material.

Advantageous further developments of the inventive concept are described hereinafter.

In order to generate from linearly polarized light an arbitrarily selected distribution of linearly polarized light rays with a minimum loss of intensity, an optically active crystal with an optical axis is used as raw material for the polarization-modulating optical element. The optical axis of a crystal, also referred to as axis of isotropy, is defined by the property that there is only one velocity of light propagation associated with the direction of the optical axis. In other words, a light ray traveling in the direction of an optical axis is not subject to a linear birefringence. The polarization-modulating optical element has a thickness profile that varies in the directions perpendicular to the optical axis of the crystal. The term "linear polarization distribution" in this context and hereinafter is used with the meaning of a polarization distribution in which the individual light rays are linearly polarized but the oscillation planes of the individual electrical field vectors can be oriented in different directions.

If linearly polarized light traverses the polarization-modulating optical element along the optical axis of the crystal, the oscillation plane of the electrical field vector is rotated by an angle that is proportional to the distance traveled inside the crystal. The sense of rotation, i.e., whether the oscillation plane is rotated clockwise or counterclockwise, depends on the crystal material, for example right-handed quartz vs. left-handed quartz. The polarization plane is parallel to the respective directions of the polarization and the propagation of the light ray. In order to produce an arbitrarily selected distribution of the angles of rotation, it is advantageous if the thickness profile is designed so that the plane of oscillation of a first linearly polarized light ray and the plane of oscillation of a second linearly polarized light ray are rotated, respectively, by a first and a second angle of rotation, with the first angle of rotation being different from the second angle of rotation. By shaping the element with a specific thickness at each location, it is possible to realize arbitrarily selected angles of rotation for the oscillation planes.

Different optically active materials have been found suitable dependent on the wavelength of the radiation being used, specifically quartz, $TeO_2$, and $AgGaS_2$.

In an advantageous embodiment of the invention, the polarization-modulating optical element has an element axis oriented in the same direction as the optical axis of the crystal. In relation to the element axis, the thickness profile of the optical element is a function of the azimuth angle $\theta$ alone, with the azimuth angle $\theta$ being measured relative to a reference axis that intersects the element axis at a right angle. With a thickness profile according to this design, the thickness of the optical element is constant along a radius that intersects the element axis at a right angle and forms an azimuth angle $\theta$ with the reference axis.

In a further advantageous embodiment of the invention, an azimuthal section $d(r=const., \theta)$ of the thickness profile $d(r,\theta)$ at a constant distance r from the element axis is a linear function of the azimuth angle $\theta$. In the ideal case, this azimuthal section has a discontinuity at the azimuth angle $\theta=0$. The linear function $d(r=const., \theta)$ at a constant distance r from the element axis has a slope $$|m| = \frac{180°}{\alpha \pi r},$$

wherein $\alpha$ stands for the specific rotation of the optically active crystal. At the discontinuity location for $\theta=0$, there is an abrupt step in the thickness by an amount of $360°/\alpha$. The step at the discontinuity location can also be distributed over an azimuth angle range of a few degrees. However, this has the result of a non-optimized polarization distribution in the transition range.

In a further advantageous embodiment of the invention, an azimuthal section $d(r=const., \theta)$ of the thickness profile $d(r,\theta)$ at a constant distance r from the element axis is a linear function of the azimuth angle $\theta$ with the same slope m but, in the ideal case, with two discontinuities at the azimuth angles $\theta=0$ and $\theta=180°$, respectively. At each discontinuity location, there is an abrupt step in the thickness by an amount of $180°/\alpha$. The two abrupt steps at the discontinuity locations can also be distributed over an azimuth angle range of a few degrees. However, this has the result of a non-optimized polarization distribution in the transition range.

In a further advantageous embodiment of the invention, an azimuthal section $d(r=const., \theta)$ of the thickness profile $d(r,\theta)$ at a constant distance r from the element axis and in a first azimuth angle range of $10°<\theta<170°$ is a linear function of the azimuth angle $\theta$ with a first slope m, while in a second azimuth angle range of $190°<\theta<350°$, the azimuthal section is a linear function of the azimuth angle $\theta$ with a second slope n. The slopes m and n have the same absolute magnitude but opposite signs. The magnitude of the slopes m and n at a distance r from the element axis is $$|m| = |n| = \frac{180°}{\alpha \pi r}.$$

With this arrangement, the thickness profile for all azimuth angles, including $\theta=0$ and $\theta=180°$, is a continuous function without abrupt changes in thickness.

In a further advantageous embodiment of the invention, the polarization-modulating optical element is divided into a large number of planar-parallel portions of different thickness or comprises at least two planar-parallel portions. These portions can for example be configured as sectors of a circle, but they could also have a hexagonal, square, rectangular, or trapezoidal shape.

In a further advantageous embodiment of the invention, a pair of first plan-parallel portions are arranged on opposite sides of a central element axis of said polarization-modulating optical element, and a pair of second plan-parallel portions are arranged on opposite sides of said element axis and circumferentially displaced around said element axis with respect to said first plan-parallel portions, wherein each of said first portions has a thickness being different from a thickness of each of said second portions.

In a further advantageous embodiment of the invention, a plane of oscillation of linearly polarized light passing through the polarization-modulating optical element is rotated by a first angle of rotation $\beta_1$ within at least one of said first plan-parallel portions and by a second angle of rotation $\beta_2$ within at least one of said second plan-parallel portions, such that $\beta_1$ and $\beta_2$ are approximately conforming or conform to the expression $|\beta_2-\beta_1|=(2n+1)\cdot 90°$, with n representing an integer.

In an advantageous embodiment, $\beta_1$ and $\beta_2$ are approximately conforming or conform to the expressions $\beta_1=90°+p\cdot 180°$, with p representing an integer, and $\beta_2=q\cdot 180°$, with q representing an integer other than zero. As will discussed below in more detail, such an embodiment of the polarization modulating optical element may be advantageously used in affecting the polarization of traversing polarized light such that exiting light has a polarization distribution being—depending of the incoming light—either approximately tangentially or approximately radially polarized.

The pair of second plan-parallel portions may particularly be circumferentially displaced around said element axis with respect to said pair of first plan-parallel portions by approximately 90°.

In a further advantageous embodiment of the invention, said pair of first plan-parallel portions and said pair of second plan-parallel portions are arranged on opposite sides of a central opening or a central obscuration of said polarization-modulating optical element.

Adjacent portions of said first and second pairs can be spaced apart from each other by regions being opaque to linearly polarized light entering said polarization-modulating optical element. Said portions of said first and second group can particularly be held together by a mounting. Said mounting can be opaque to linearly polarized light entering said polarization-modulating optical element. The mounting can have a substantially spoke-wheel shape.

In a further advantageous embodiment of the invention, the polarization-modulating optical element comprises a first group of substantially planar-parallel portions wherein a plane of oscillation of traversing linearly polarized light is rotated by a first angle of rotation $\beta_1$, and a second group of substantially planar-parallel portions wherein a plane of oscillation of traversing linearly polarized light is rotated by a second angle of rotation, such that $\beta_1$ and $\beta_2$ are approximately conforming or conform to the expression $|\beta_2-\beta_1|=(2n+1)\cdot 90°$, with n representing an integer.

In a further advantageous embodiment of the invention, $\beta_1$ and $\beta_2$ are approximately conforming to the expressions $\beta_1=90°+p\cdot 180°$, with p representing an integer, and $\beta_2=q\cdot 180°$, with q representing an integer other than zero.

In a further advantageous embodiment of the invention, the thickness profile of the polarization-modulating optical element has a continuous surface contour without abrupt changes in thickness, whereby an arbitrarily selected polarization distribution can be generated whose thickness profile is represented by a continuous function of the location.

To ensure an adequate mechanical stability of the optical element, it is important to make the minimal thickness drain of the polarization-modulating optical element at least equal to 0.002 times the element diameter D.

If the optically active material used for the optical element also has birefringent properties as is the case for example with crystalline quartz, the birefringence has to be taken into account for light rays whose direction of propagation deviates from the direction of the optical crystal axis. A travel distance of 90°/a inside the crystal causes a linear polarization to be rotated by 90°. If birefringence is present in addition to the rotating effect, the 90° rotation will be equivalent to an exchange between the fast and slow axis in relation to the electrical field vector of the light. Thus, a total compensation of the birefringence is provided for light rays with small angles of incidence if the distance traveled inside the crystal equals an integer multiple of 180°/α. In order to meet the aforementioned requirement for mechanical stability while simultaneously minimizing the effects of birefringence, it is of particular advantage if the polarization-modulating optical element is designed with a minimum thickness of $$d_{min} = N \cdot \frac{90°}{\alpha},$$

where N represents a positive integer.

From a manufacturing point of view, it is particularly advantageous to provide the optical element with a hole at the center or with a central obscuration For light rays propagating not exactly parallel to the optical crystal axis, there will be deviations of the angle of rotation. In addition, the birefringence phenomenon will have an effect. It is therefore particularly advantageous if the maximum angle of incidence of an incident light bundle with a large number of light rays within a spread of angles relative to the optical crystal axis is no larger than 100 mrad, preferably no larger than 70 mrad, and with special preference no larger than 45 mrad.

In order to provide an even more flexible control over a state of polarization, an optical arrangement is advantageously equipped with a device that allows at least one further polarization-modulating optical element to be placed in the light path. This further polarization-modulating optical element can be an additional element with the features described above. However, it could also be configured as a planar-parallel plate of an optically active material or an arrangement of two half-wavelength plates whose respective fast and slow axes of birefringence are rotated by 45° relative to each other.

The further polarization-modulating optical element that can be placed in the optical arrangement can in particular be designed in such a way that it rotates the oscillation plane of a linearly polarized light ray by 90°. This is particularly advantageous if the first polarization-modulating element in the optical arrangement produces a tangential polarization. By inserting the 90°-rotator, the tangential polarization can be converted to a radial polarization.

In a further embodiment of the optical arrangement, it can be advantageous to configure the further polarization-modulating optical element as a planar-parallel plate which works as a half-wavelength plate for a half-space that corresponds to an azimuth-angle range of 180°. This configuration is of particular interest if the first polarization-modulating optical element has a thickness profile (r=const., θ) that varies only with the azimuth angle θ and if, in a first azimuth angle range of 10°<θ<170°, the thickness profile (r=const., θ) is a linear function of the azimuth angle θ with a first slope m, while in a second azimuth angle range of 190°<θ<350°, the thickness profile is a linear function of the azimuth angle θ with a second slope n, with the slopes m and n having the same absolute magnitude but opposite signs.

The refraction occurring in particular at sloped surfaces of a polarization-modulating element can cause a deviation in the direction of an originally axis-parallel light ray after it has passed through the polarization-modulating element. In order to compensate this type of deviation of the wave front which is caused by the polarization-modulating element, it is advantageous to arrange a compensation plate of a not optically active material in the light path of an optical system, with a thickness profile of the compensation plate designed so that it substantially compensates an angular deviation of the transmitted radiation that is caused by the polarization-modulating optical element. Alternatively, an immersion fluid covering the profiled surface of the polarization-modulating element could be used for the same purpose.

Polarization-modulating elements of the foregoing description, and optical arrangements equipped with them, are advantageously used in projection systems for microlithography applications. In particular, polarization-modulating elements of this kind and optical arrangements equipped with them are well suited for projection systems in which the aforementioned immersion technique is used, i.e., where an immersion medium with a refractive index different from air is present in the space between the optical element nearest to the substrate and the substrate.

BRIEF DESCRIPTION OF THE DRAWINGS

The invention will hereinafter be explained in more detail with reference to the attached drawings, wherein:

FIG. 4b illustrates the thickness profile as a function of the azimuth angle in the embodiment of the polarization-modulating optical element of FIG. 4a;

FIG. 5 schematically illustrates the polarization distribution of a bundle of light rays before and after passing through the polarization-modulating optical element with the thickness profile according to FIG. 3 or 4d;

FIG. 6 schematically illustrates the polarization distribution of a bundle of light rays before and after passing through an optical arrangement with the polarization-modulating optical element with the thickness profile according to FIG. 3 and a further polarization-modulating optical element;

FIG. 11 shows schematically a temperature compensated polarization-modulating optical element for the application in an optical system.

PROVISIONAL DESCRIPTION OF PREFERRED EMBODIMENTS

Figure 1:
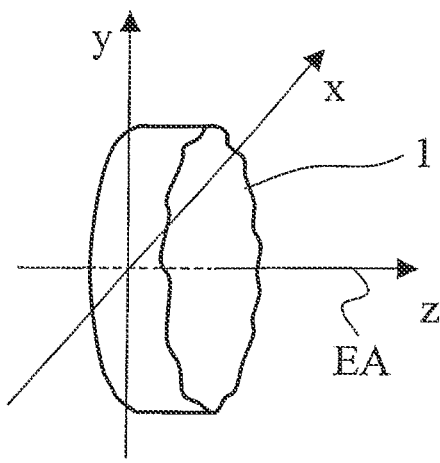
FIG. 1 illustrates a polarization-modulating optical element with a thickness profile.

FIG. 1 illustrates a polarization-modulating optical element 1 of an optically active material. Particularly well suited for this purpose are optically active crystals with at least one optical crystal axis which are transparent for the wavelength of the light being used. For example $TeO_2$ works in a range of wavelengths from 1000 nm down to 300 nm, $AgGaS_2$ works from 500 nm to 480 nm, and quartz from 800 nm down to 193 nm. The polarization-modulating optical element 1 is designed so that the element axis is oriented parallel to the optical crystal axis. In order to produce a selected polarization distribution, the optical element 1 is designed with a thickness profile (measured parallel to the element axis EA) which varies in the directions perpendicular to the element axis EA, also comprising variations in thickness of the optical element in an azimuth direction θ (see FIG. 3) at e.g. a fixed distance of the element axis EA.

Figure 2:
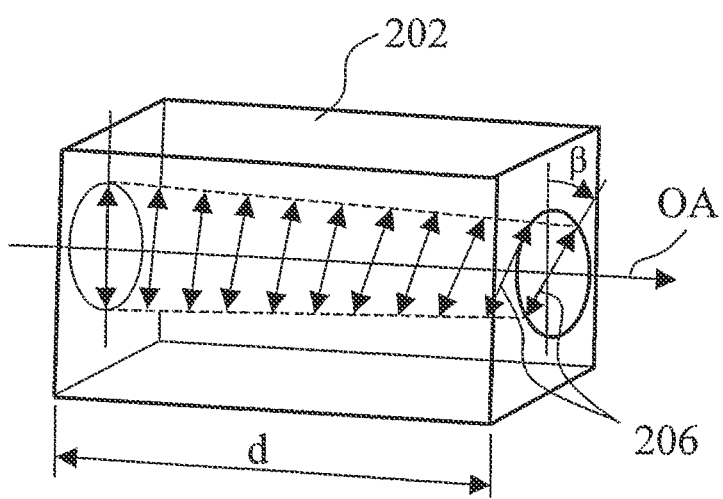
FIG. 2 schematically illustrates how the plane of oscillation is rotated when a linearly polarized light ray propagates along the optical axis in an optically active crystal.

FIG. 2 will serve to explain the function of optically active crystals, and in particular of polarization-modulating elements made from such crystals, in more detail.

Optically active crystals have at least one optical axis OA which is inherent in the crystal structure. When linearly polarized light travels along this optical axis OA, the plane of oscillation of the electrical field vector 206 is rotated by an angle β of proportionate magnitude as the distance d traveled by the light inside the crystal 202. The proportionality factor between distance d and angle of rotation is the specific rotation α. The latter is a material-specific quantity and is dependent on the wavelength of the light rays propagating through the crystal. For example in quartz, the specific rotation at a wavelength of 180 nm was measured as about α=(325.2±0.5) °/mm, at 193 nm α=323.1°/mm at a temperature of 21.6° C.

It is also important for the present invention, applying optically active materials in an illumination system and/or an objective of a projection optical system of e.g. a projection apparatus used in microlithography, that also the temperature dependency of the specific rotation is considered. The temperature dependency of the specific rotation α for a given wavelength is to a good and first linear approximation given by $\alpha(T)=\alpha_0(T_0)+\gamma^*(T-T_0)$, where γ is the linear temperature coefficient of the specific rotation α. In this case α(T) is the optical activity coefficient or specific rotation at the temperature T and $\alpha_0$ is the specific rotation at a reference temperature $T_0$. For optical active quartz material the value γ at a wavelength of 193 nm and at room temperature is γ=2.36 mrad/(mm*K).

Referring again to FIG. 2, in particular, light that propagates inside the crystal 202 along the optical axis OA is not subject to a linear birefringence. Thus, when a linearly polarized light ray traverses an optically active crystal 202 along the optical axis OA, its state of polarization remains the same except for the change in the spatial orientation of the plane of oscillation of the electrical field vector 206 which depends on the distance d traveled by the light ray inside the crystal 202.

Based on this property of an optically active crystal, it is possible to produce an arbitrarily selected linear polarization distribution by designing the polarization-modulating optical element 1 of FIG. 1 with a thickness profile that varies dependent on the location. The thickness profile is designed to have the effect that the directions of polarization of parallel linearly polarized light rays are rotated by an angle that varies dependent on the location where the light ray traverses the optical element.

More general, alternative or in addition to the variation of the thickness d=d(x,y) of the polarization-modulating element, the specific rotation $\alpha$ may itself be dependent on the location within the modulating element such that a becomes an $\alpha(x,y,z)$ or $\alpha(r,\theta,z)$, where x,y or r,$\theta$ are Cartesian or polar coordinates in a plane perpendicular to the element axis EA (or alternative to the optical axis OA) of the polarization-modulating element, as shown e.g. in FIG. 1, where z is the axis along the element axis EA. Of course also a description in spherical-coordinates like r,$\theta$,$\varphi$, or others is possible. Taking into account the variation of the specific rotation $\alpha$, the polarization-modulating optical element in general comprises a varying profile of the "optical effective thickness D" defined as $D(x,y)=d(x,y)*\alpha(x,y)$, if there is no dependency of $\alpha$ in z-direction. In the case that $\alpha$ may also depend on the z-direction (along the optical axis or element axis EA, or more general along a preferred direction in an optical system or a direction parallel to the optical axis of an optical system) D has to be calculated by integration $D(x,y)=\int\alpha(x,y,z)\,dz(x,y)$, along the polarization-modulating optical element. In general, if a polarization-modulating optical element is used in an optical system, having an optical axis or a preferred direction defined by the propagation of a light beam through the optical system, the optical effective thickness D is calculated by integrating the specific rotation $\alpha$ along the light path of a light ray within the polarization-modulating optical element. Under this general aspect the present invention relates to an optical system comprising an optical axis or a preferred direction given by the direction of a light beam propagating through the optical system. The optical system also comprises a polarization-modulating optical element described by coordinates of a coordinate system, wherein one preferred coordinate of the coordinate system is parallel to the optical axis of the optical system or parallel to the preferred direction. As an example, in the above case this preferred direction was the z-coordinate which is the preferred coordinate. Additionally the polarization-modulating optical element comprises optical active material and also a profile of effective optical thickness D as defined above, wherein the effective optical thickness D varies at least as a function of one coordinate different from the preferred coordinate of the coordinate system describing the polarization-modulating optical element. In the above example the effective optical thickness D varies at least as a function of the x- or y-coordinate, different from the z-coordinate (the preferred coordinate). There are different independent methods to vary the effective optical thickness of an optical active material. One is to vary the specific rotation by a selection of appropriate materials, or by subjecting the optically active material to a non-uniform temperature distribution, or by varying the geometrical thickness of the optically active material. Also combinations of the mentioned independent methods result in a variation of the effective optical thickness of an optical active material.

Figure 3:
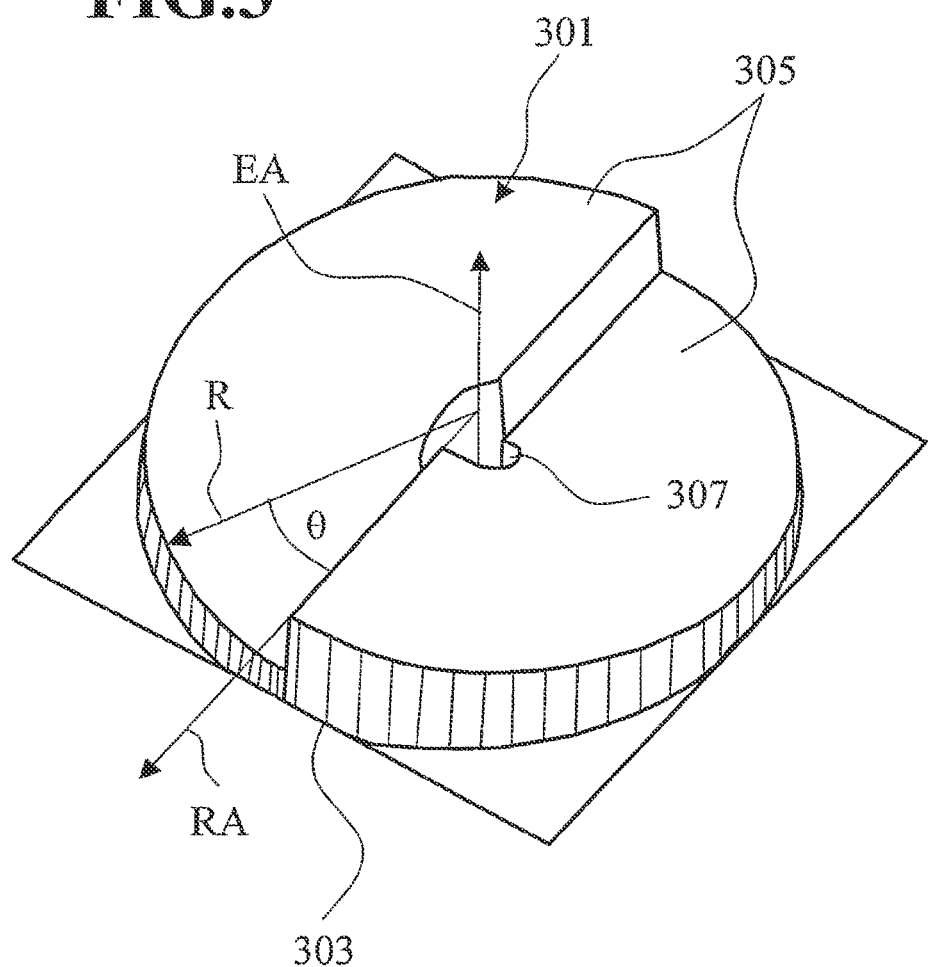
FIG. 3 illustrates a first exemplary embodiment of a polarization-modulating optical element.

FIG. 3 illustrates an embodiment of the polarization-modulating optical element 301 which is suited specifically for producing a tangential polarization. A detailed description will be presented in the context of FIGS. 4d and 5. The embodiment illustrated in FIG. 3 will serve to introduce several technical terms that will be used hereinafter with the specific meanings defined here.

The polarization-modulating optical element 301 has a cylindrical shape with a base surface 303 and an opposite surface 305. The base surface 303 is designed as a planar circular surface. The element axis EA extends perpendicular to the planar surface. The opposite surface 305 has a contour shape in relation to the element axis EA in accordance with a given thickness profile. The optical axis of the optically active crystal runs parallel to the element axis EA. The reference axis RA, which extends in the base plane, intersects the element axis at a right angle and serves as the reference from which the azimuth angle $\theta$ is measured. In the special configuration illustrated in FIG. 3, the thickness of the polarization-modulating optical element 301 is constant along a radius R that is perpendicular to the element axis EA and directed at an angle $\theta$ relative to the reference axis RA. Thus, the thickness profile in the illustrated embodiment of FIG. 3 depends only on the azimuth angle $\theta$ and is given by $d=d(\theta)$. The optical element 301 has an optional central bore 307 coaxial with the element axis EA. In an other preferred embodiment of the polarization-optical element the thickness may vary along the radius R such that the thickness profile is $d=d(R,\theta)$. In a further more generalized preferred embodiment the thickness profile shown in FIG. 3 is not representing the geometrical thickness d of the polarization-optical element, as described above, but the profile represents the optical effective thickness $D=D(R,\theta)=D(x,y)$, depending on the used coordinate system. In this case also any profile of the specific rotation like e.g. $\alpha=\alpha(x,y)=\alpha(R,\theta)$ or $\alpha=\alpha(x,y,z)=\alpha(R,\theta,z)$ is considered in the profile of the polarization-modulating optical element which is effective for a change in the direction of the polarization plane of a passed light beam.

In addition it should be mentioned that the polarization-modulating optical element 301 not necessary need to comprise a planar base surface 303. This surface in general can also comprise a contour shaped surface e.g. similar or equal to the surface as designated by 305 shown in FIG. 3. In such a case it is of advantage to describe the contour surfaces 303 and 305 relative to a plane surface perpendicular to the optical axis or element axis.

Figure 4A:
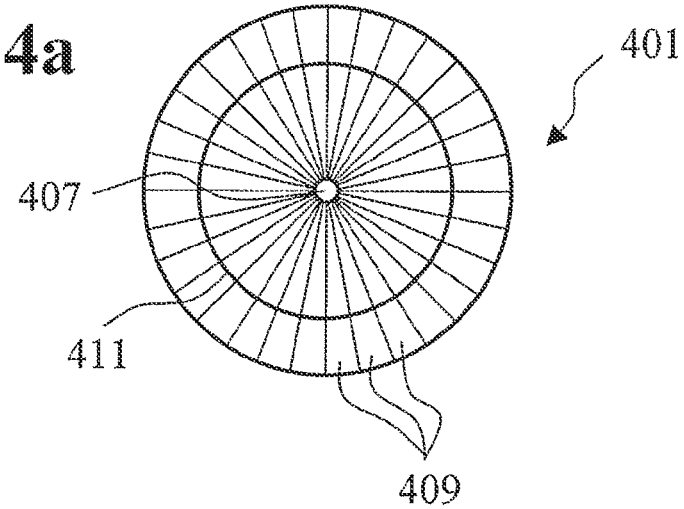
FIG. 4a schematically illustrates a second exemplary embodiment of a polarization-modulating optical element.

FIG. 4a schematically illustrates a further embodiment of the polarization-modulating optical element 401. The element axis EA through the center of the polarization-modulating optical element 401 in this representation runs perpendicular to the plane of the drawing, and the optical crystal axis of the crystal runs parallel to the element axis. Like the embodiment of FIG. 3, the polarization-modulating optical element 401 has an optional central bore 407. The polarization-modulating optical element 401 is divided into a large number of planar-parallel portions 409 in the shape of sectors of a circle which differ in their respective thicknesses. Alternative embodiments with different shapes of the portions 409 are conceivable. They could be configured, e.g., as hexagonal, square, rectangular or trapeze-shaped raster elements.

As described in connection with FIG. 3, the embodiment according to FIG. 4 a can be modified such that the different thicknesses of the sectors should be understood as different effective optical thicknesses D. In this case the specific rotation $\alpha$ may vary from one segment to the other too. To manufacture such an embodiment, the polarization-modulating optical element can e.g. have a shape as shown in FIG. 4a in which the sectors 409 are at least partly exchanged e.g. by any optical inactive material, which is the simplest case to vary the specific rotation $\alpha$ to zero. Also as a further embodiment the sectors 409 may be replaced by cuvettes or cells which are filed with an optical active or optical inactive liquid. In this case the polarization-modulating optical element may comprise optical active and optical inactive sections. If the sectors 409 are only party replaced by cuvettes or if at least one cuvette is used in the polarization-modulating optical element 401, a combination of e.g. optical active crystals with e.g. optical active or optical inactive liquids in one element 40 is possible. Such an optical system according to the present invention may comprise a polarization-modulating optical element which comprises an optically active or an optically inactive liquid and/or an optically active crystal. Further, it is advantageously possible that the polarization-modulating optical element of the optical system according to the present invention comprises clockwise and counterclockwise optically active materials. These materials could be solid or liquid optically active materials. Using liquids in cuvettes has the advantage that by changing the liquids, or the concentration of the optical active material within the liquid, the magnitude of the change in polarization can be easily controlled. Also any thermal changes of the specific rotation $\alpha$ due to the thermal coefficient $\gamma$ of the specific rotation $\alpha$ can be controlled e.g. by temperature control of the optical active liquid such that either the temperature is constant within the cuvette, or that the temperate has predefined value T such that the specific rotation will have the value $\alpha(T)=\alpha_0(T_0)+\gamma^*(T-T_0)$. Also the formation of a certain temperature distribution within the liquid may be possible with appropriate heating and/or cooling means controlled by control means.

The optical systems in accordance with the present invention advantageously modify respective planes of oscillation of a first linearly polarized light ray and a second linearly polarized light ray. Both light rays propagating through the optical system, and being at least a part of the light beam propagating through the optical system. The light rays are also passing the polarization-modulating optical element with different paths, and are rotated by a respective first and second angle of rotation such that the first angle is different of the second angle. In general the polarization-modulating optical element of the optical systems according to the present invention transform a light bundle with a first linear polarization distribution, which enters said polarization-modulating optical element, into a light bundle exiting said polarization-modulating optical element. The exiting light bundle having a second linear polarization distribution, wherein the second linear polarization distribution is different from the first linear polarization distribution.

Figure 4B:
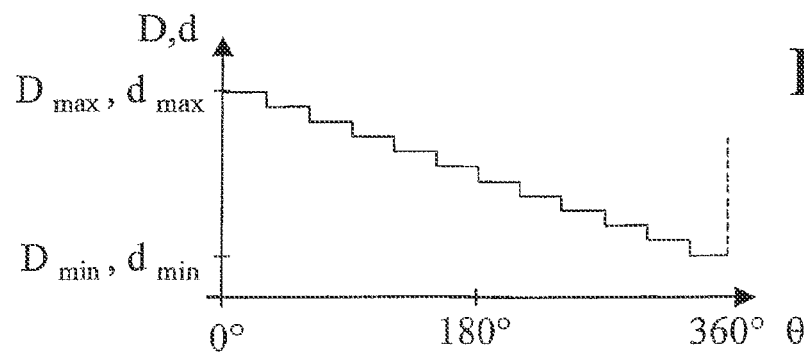

FIG. 4b shows the thickness profile along an azimuthal section $d(r=const., \theta)$ for the polarization-modulating optical element 401 divided into sectors as shown in FIG. 4a. The term azimuthal section as used in the present context means a section traversing the thickness profile $d(\theta,r)$ along the circle 411 marked in FIG. 4a, i.e., extending over an azimuth angle range of $0° \leq \theta \leq 360°$ at a constant radius r. In general the profile shows the optical effective thickness $D=D(\theta)$ along a circle 411.

An azimuthal section of a polarization-modulating optical element 401 that is divided into sector-shaped portions has a stair-shaped profile in which each step corresponds to the difference in thickness d or optical effective thickness D between neighboring sector elements. The profile has e.g. a maximum thickness $d_{max}$ and a minimum thickness $d_{min}$. In order to cover a range of $0 \leq \beta \leq 360°$ for the range of the angle of rotation of the oscillation plane of linearly polarized light, there has to be a difference of $360°/\alpha$ between $d_{max}$ and $d_{min}$. The height of each individual step of the profile depends on the number n of sector elements and has a magnitude of $360°/(n \cdot \alpha)$. At the azimuth angle $\theta=0°$, the profile has a discontinuity where the thickness of the polarization-modulating optical element 401 jumps from $d_{min}$ to $d_{max}$. A different embodiment of the optical element can have a thickness profile in which an azimuthal section has two discontinuities of the thickness, for example at $\theta=0°$ and $\theta=180°$.

In an alternative embodiment the profile has e.g. a maximum optical effective thickness $D_{max}$ and a minimum optical effective thickness $D_{min}$, and the geometrical thickness d is e.g. constant, resulting in a variation of the specific rotation $\alpha$ of the individual segments 409 of the element 401. In order to cover a range of $0 \leq \beta \leq 360°$ for the range of the angle of rotation of the oscillation plane of linearly polarized light, there has to be a difference of $360°/d$ between $\alpha_{max}$ and $\alpha_{min}$. The change of the specific rotation of each individual step of the profile depends on the number n of sector elements 409 and has a magnitude of $360°/(n \cdot d)$. At the azimuth angle $\theta=0°$, the profile has a discontinuity regarding the optical effective thickness where it jumps from $D_{min}$ to $D_{max}$. It should be pointed out, that advantageously in this embodiment there is no discontinuity in the geometrical thickness d of the polarization-modulating element 401. Also the thickness profile of the optical effective thickness in which an azimuthal section has two discontinuities of the optical effective thickness can easily be realized, for example at $\theta=0°$ and $\theta=180°$. To realize the defined changes in magnitude of the specific rotation of $\Delta\alpha=360°/(n \cdot d)$ (if there a n angular segments 409 to form the element 401), the individual sector elements 409 are preferably made of or comprises cuvettes or cells, filled with an optical active liquid with the required specific rotation $\alpha$. As an example, for the m-th sector element the specific rotation is $\alpha(m)=\alpha_{min}+m^*360°/(n \cdot d)$, and $0 \leq m \leq n$. The required specific rotation e.g. can be adjusted by the concentration of the optical active material of the liquid, or by changing the liquid material itself.

In a further embodiment the segments 409 of a polarization-modulating optical element 401 may comprise components of solid optically active material (like crystalline quartz) and cells or cuvettes filled with optically active material, and these components are placed behind each other in the light propagation direction. Alternative or in addition the cuvette itself may comprise optically active material like crystalline quartz.

The polarization-modulating optical element of the foregoing description converts linearly polarized incident light into a linear polarization distribution in which the oscillation planes of linearly polarized light rays are rotated by an angle that depends on the thickness (or optical effective thickness) of each individual sector element. However, the angle by which the direction of polarization is rotated is constant over an individual sector element. Thus, the distribution function for the directions of the oscillation planes of the individual field vectors takes only certain discrete values.

A continuous distribution of linear polarizations can be achieved with an optical element that has a continuously varying thickness (optical effective thickness) profile along an azimuthal section.

Figure 4C:
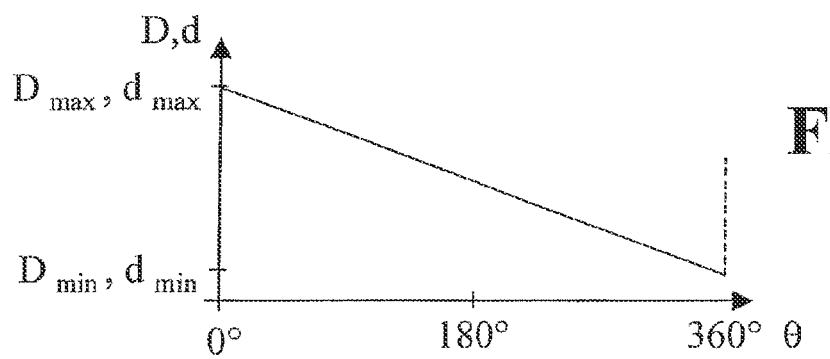
FIG. 4c illustrates the thickness profile as a function of the azimuth angle in a further embodiment of the polarization-modulating optical element.

An example of a continuously varying thickness profile is illustrated in FIG. 4c. The azimuthal section 411 in this embodiment shows a linear decrease in thickness (in general optical effective thickness) with a slope $m=-180°/(\alpha \cdot \pi)$ over an azimuth-angle range of $0 \leq \theta \leq 360°$. Here the slope is defined a slope of a screw. Alternatively the slope cafl be defined by $m=-180°/(\alpha^*\pi^*r)$ where r is the radius of a circle centered at the element axis EA. In this case the slope depends on the distance of the element axis, e.g. if the polarization-modulating optical element 301 has a given constant screw-slope (lead of a screw).

The symbol a in this context stands for the specific rotation of the optically active crystal. As in the previously described embodiment of FIG. 4b, the thickness profile of FIG. 4c has likewise a discontinuity at the azimuth angle $\theta=0°$, the thickness of the polarization-modulating optical element 401 jumps from $d_{min}$ to $d_{max}$ by an amount of approximately $360°/\alpha$.

Figure 4D:
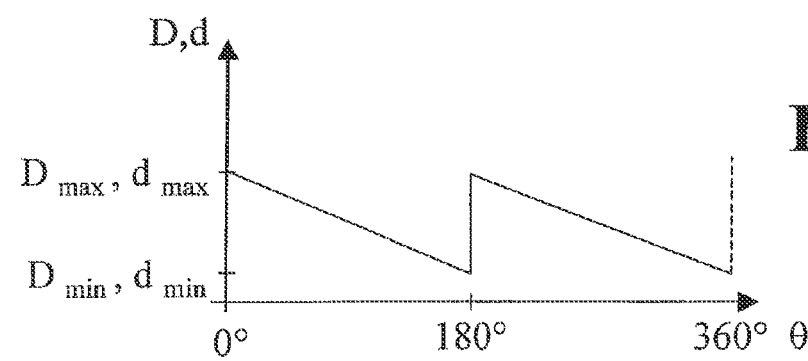
FIG. 4d illustrates the thickness profile as a function of the azimuth angle in the embodiment of the polarization-modulating optical element of FIG. 3.

A further embodiment of a polarization-modulating optical element which is shown in FIG. 4d has a thickness profile (in general optical effective thickness profile) which is likewise suitable for producing a continuous distribution of linear polarizations, in particular a tangentially oriented polarization. This thickness profile corresponds to the embodiment shown in FIG. 3, in which the angle θ is measured in counterclockwise direction. The azimuthal section 411 in this embodiment is a linear function of the azimuth angle θ with a slope m=−180°/(α·π) over each of two ranges of 0<θ<180° and 180°<θ<360°. The thickness profile has discontinuities at θ=0° and θ=180° where the thickness rises abruptly from $d_{min}$ to $d_{max}$ by an amount of 180°/α.

Figure 4E:
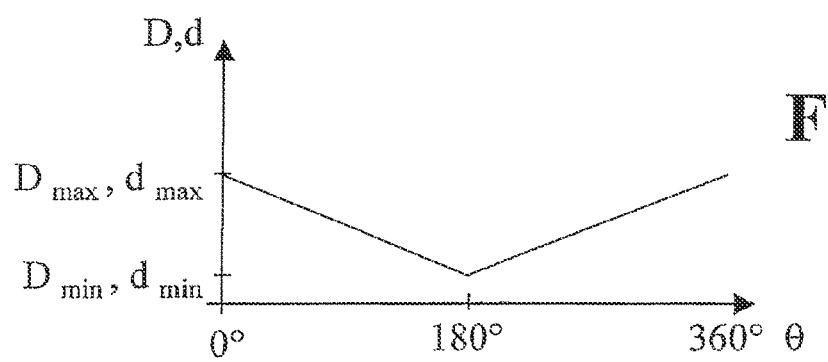
FIG. 4e illustrates the thickness profile as a function of the azimuth angle in a further embodiment of the polarization-modulating optical element.

FIG. 4e represents the thickness profile (in general optical effective thickness profile) along an azimuthal section for a further embodiment of the polarization-modulating optical element 401. The azimuthal section is in this case a linear function of the azimuth angle θ with a first slope m for 0<θ<180° and with a second slope n for 180°<θ<360°. The slopes m and n are of equal absolute magnitude but have opposite signs. The respective amounts for m and n at a distance r from the element axis are m=−180°/(α·π·r) and n=180°/(α·π·r). While the difference between the minimum thickness $d_{min}$ and the maximum thickness $d_{max}$ is again approximately 180°/α, i.e., the same as in the embodiment of FIG. 4d, the concept of using opposite signs for the slope in the two azimuth angle ranges avoids the occurrence of discontinuities.

Additionally it is mentioned that for certain special applications clockwise and counterclockwise optically active materials are combined in a polarization-modulating optical element.

As the slope of the thickness profile along an azimuthal section increases strongly with smaller radii, it is advantageous from a manufacturing point of view to provide a central opening 407 or a central obscuration in a central portion around the central axis of the circular polarization-modulating optical element.

It is furthermore necessary for reasons of mechanical stability to design the polarization-modulating optical element with a minimum thickness $d_{min}$ of no less than two thousandths of the element diameter. It is particularly advantageous to use a minimum thickness of $d_{min}$=N·90°/α, where N is a positive integer. This design choice serves to minimize the effect of birefringence for rays of an incident light bundle which traverse the polarization-modulating element at an angle relative to the optical axis.

Figure 4F:
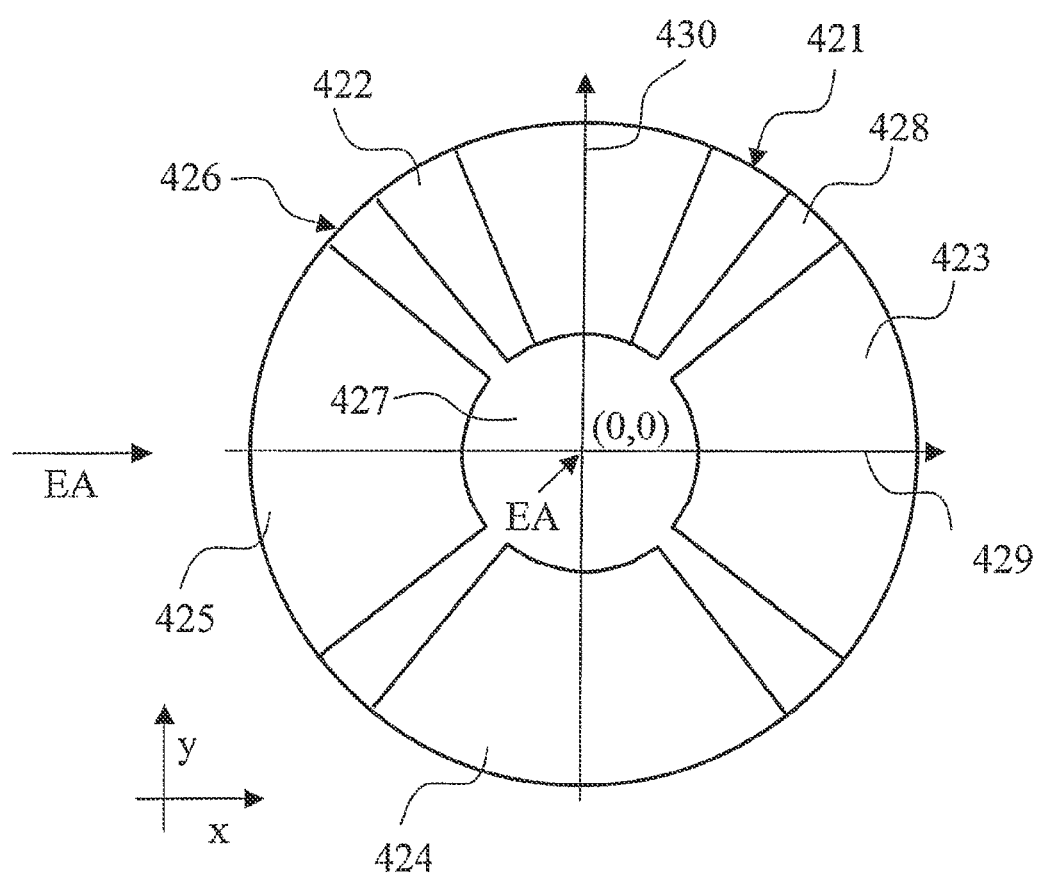
FIG. 4f schematically illustrates a further exemplary embodiment of a polarization-modulating optical element.

FIG. 4f schematically illustrates a further embodiment 421 of the polarization-modulating optical element. As in FIG. 4a, the element axis EA through the center of the polarization-modulating optical element 421 runs perpendicular to the plane of the drawing, and the optical crystal axis runs parallel to the element axis. However, in contrast to the embodiments of FIGS. 3 and 4a where the polarization-modulating optical elements 301, 401 are made preferably of one piece like in the case of crystalline material like crystalline quartz, the polarization-modulating optical element 421 comprises of four separate sector-shaped parts 422, 423, 424, 425 of an optically active crystal material which are held together by a mounting device 426 which can be made, e.g., of metal and whose shape can be described as a circular plate 427 with four radial spokes 428. The mounting is preferably opaque to the radiation which is entering the polarization-modulating optical element, thereby serving also as a spacer which separates the sector-shaped parts 422, 423, 424, 425 from each other. Of course the embodiment of the present invention according to FIG. 4f is not intended to be limited to any specific shape and area of mounting device 426, which may also be omitted.

According to an alternate embodiment not illustrated in FIG. 4f, incident light which is entering the polarization-modulating optical element can also be selectively directed onto the sector-shaped parts, e.g. by means of a diffractive structure or other suitable optical components.

The sector-shaped parts 422 and 424 have a first thickness d1 which is selected so that the parts 422 and 424 cause the plane of oscillation of linearly polarized axis-parallel light to be rotated by 90°+p·180°, where p represents an integer. The sector-shaped parts 423 and 425 have a second thickness d2 which is selected so that the parts 423 and 425 cause the plane of oscillation of linearly polarized axis-parallel light to be rotated by q·180°, where q represents an integer other than zero. Thus, when a bundle of axis-parallel light rays that are linearly polarized in the y-direction enters the polarization-modulating optical element 421, the rays that pass through the sector-shaped parts 423 and 425 will exit from the polarization-modulating optical element 421 with their plane of oscillation unchanged, while the rays that pass through the sector-shaped parts 422 and 424 will exit from the polarization-modulating optical element 421 with their plane of oscillation rotated into the x-direction. As a result of passing through the polarization-modulating optical element 421, the exiting light has a polarization distribution which is exactly tangential at the centerlines 429 and 430 of the sector-shaped parts 422, 423, 424, 425 and which approximates a tangential polarization distribution for the rest of the polarization-modulating optical element 421.

When a bundle of axis-parallel light rays that are linearly polarized in the x-direction enters the polarization-modulating optical element 421, the rays that pass through the sector-shaped parts 423 and 425 will exit from the polarization-modulating optical element 421 with their plane of oscillation unchanged, while the rays that pass through the sector-shaped parts 422 and 424 will exit from the polarization-modulating optical element 421 with their plane of oscillation rotated into the y-direction. As a result of passing through the polarization-modulating optical element 421, the exiting light has a polarization distribution which is exactly radial at the centerlines 429 and 430 of the sector-shaped parts 422, 423, 424, 425 and which approximates a radial polarization distribution for the rest of the polarization-modulating optical element 421.

Of course the embodiment of the present invention according to FIG. 4f is not intended to be limited to the shapes and areas and the number of sector-shaped parts exemplarily illustrated in FIG. 4f, so that other suitable shapes (having for example but not limited to trapeze-shaped, rectangular, square, hexagonal or circular geometries) as well as more or less sector-shaped parts 422, 423, 424 and 425 can be used. Furthermore, the angles of rotation $\beta_1$ and $\beta_2$ provided by the sector-shaped parts 422, 423, 424, 425 (i.e. the corresponding thicknesses of the sector-shaped parts 422, 423, 424, 425) may be more generally selected to approximately conform to the expression $|\beta_2-\beta_1|=(2n+1)\cdot 90°$, with n representing an integer, for example to consider also relative arrangements where incoming light is used having a polarization plane which is not necessarily aligned with the x- or y-direction. With the embodiments as described in connection with FIG. 4f it is also possible to approximate polarization distributions with a tangential polarization.

In order to produce a tangential polarization distribution from, linearly polarized light with a wave length of 193 nm and a uniform direction of the oscillation plane of the electric field vectors of the individual light rays, one can use for example a polarization-modulating optical element of crystalline quartz with the design according to FIGS. 3 and 4d. The specific rotation α of quartz for light with a wavelength of 193 nm is in the range of (325.2±0.5)°/mm, which was measured at a wavelength of 180 nm, or more precise it is 321.1°/mm at 21.6° C. The strength and effect of the optical activity is approximately constant within a small range of angles of incidence up to 100 mrad. An embodiment could for example be designed according to the following description: An amount of 276.75 μm, which approximately equals 90°/α, is selected for the minimum thickness $d_{min}$, if crystalline quartz is used Alternatively, the minimum thickness $d_{min}$ can also be an integer multiple of this amount. The element diameter is 110 mm, with the diameter of the optically active part being somewhat smaller, for example 105 mm. The base surface is designed as a planar surface as illustrated in FIG. 3. The opposite surface has a thickness profile d(r,θ) in accordance with FIG. 4d. The thickness profile is defined by the following mathematical relationships:

$$D(r, \theta) = 276.75 + \frac{180° - \theta}{180°} \cdot 553.51 \ \mu m \quad \text{for } 0 \leq \theta \leq 180° \text{ and}$$
$$r > \frac{10.5}{2} \ mm$$

$$D(r, \theta) = 276.75 + \frac{360° - \theta}{180°} \cdot 553.51 \ \mu m \quad \text{for } 180 \leq \theta \leq 360° \text{ and}$$
$$r > \frac{10.5}{2} \ mm$$

$$D(r, \theta) = 0 \quad \text{for } r \leq \frac{10.5}{2} \ mm$$

The above mentioned data are based exemplarily for a specific rotation α of (325.2±0.5)°/mm. If the specific rotation α changes to 321.1°/mm, the value at 193 nm and at a temperature of 21.6° C., the thickness profile will change as follows:

$$D(r, \theta) = 278.6 + \frac{180° - \theta}{180°} \cdot 557 \ \mu m \quad \text{for } 0 \leq \theta \leq 180° \text{ and } r > \frac{10.5}{2} \ mm$$
$$D(r, \theta) = 278.6 + \frac{360° - \theta}{180°} \cdot 557 \ \mu m \quad \text{for } 180 \leq \theta \leq 360° \text{ and } r > \frac{10.5}{2} \ mm$$
$$D(r, \theta) = 0 \quad \text{for } r \leq \frac{10.5}{2} \ mm$$

The polarization-modulating optical element according to this embodiment has a central opening 407 with a diameter 10.5, i.e., one-tenth of the maximum aperture. The thickness maxima and minima, which are found at the discontinuities, are 830.26 μm and 276.75 μm, respectively for the first given example.

The embodiment of the foregoing description can be produced with a robot-polishing process. It is particularly advantageous to produce the polarization-modulating element from two wedge-shaped or helically shaped half-plates which are seamlessly joined together after polishing. If the element is produced by half-plates, it is easy and in some applications of additional advantage to use one clockwise and one counter-clockwise optically active material like clockwise crystalline and counterclockwise crystalline quartz (R-quartz and L-quartz).

FIG. 5 schematically illustrates how a polarization-modulating optical element 501 with a thickness profile according to FIGS. 3 and 4d converts the polarization distribution of an entering light bundle 513 with a uniformly oriented linear polarization distribution 517 into a tangential polarization 519 of an exiting light bundle 515. This can be visualized as follows: A linearly polarized light ray of the entering light bundle 513 which traverses the polarization-modulating optical element at a location of minimum thickness, for example at θ=180°, covers a distance of 90°/α inside the optically active crystal. This causes the oscillation plane of the electrical field vector to be rotated by 90°. On the other hand, a linearly polarized light ray traversing the polarization-modulating optical element 501 at a location with θ=45° covers a distance of 135°/a inside the optically active crystal, thus the oscillation plane of the electrical field vector of this ray is rotated by 135°. Analogous conclusions can be drawn for each light ray of the entering light bundle 513.

FIG. 6 schematically illustrates how an optical arrangement with a polarization-modulating optical element 601 with a thickness profile according to FIGS. 3 and 4d in combination with a further polarization-modulating element 621 converts the polarization distribution of an entering light bundle 613 with a uniformly oriented linear polarization distribution 617 into a radial polarization 623 of an exiting light bundle 615. As explained in the context of FIG. 5, the polarization-modulating optical element 601 produces a tangential polarization distribution. A tangential polarization distribution can be converted into a radial polarization distribution by a 90°-rotation of the respective oscillation plane of each individual linearly polarized ray of the light bundle. There are several different possibilities to accomplish this with an optical arrangement according to FIG. 6. One possible concept is to arrange a planar-parallel plate of an optically active crystal as a further polarization-modulating element 621 in the light path, where the thickness of the plate is approximately 90°/$α_p$ with $α_p$ representing the specific rotation of the optically active crystal. As in the polarization-modulating element 601, the optical crystal axis of the planar parallel plate runs likewise parallel to the element axis. As another possible concept, the further polarization-modulating element 621 can be configured as a 90°-rotator that is assembled from two half-wave plates. A 90°-rotator consists of two half-wave plates of birefringent crystal material. Each plate has a slow axis associated with the direction of the higher refractive index and, perpendicular to the slow axis, a fast axis associated with the direction of the lower refractive index. The two half-wave plates are rotated relative to each other so their respective fast and slow axes are set at an angle of 45° from each other.

Of course further possible embodiments for producing a radial polarization distribution are conceivable within the scope of the invention. For example, the further polarization-modulating optical element 621 can be connected to the polarization-modulating optical element 601. To allow a fast change-over from tangential to radial polarization, one could provide an exchange device that allows the further polarization-modulating element 621 to be placed in the light path and to be removed again or to be replaced by another element.

Figure 7A:
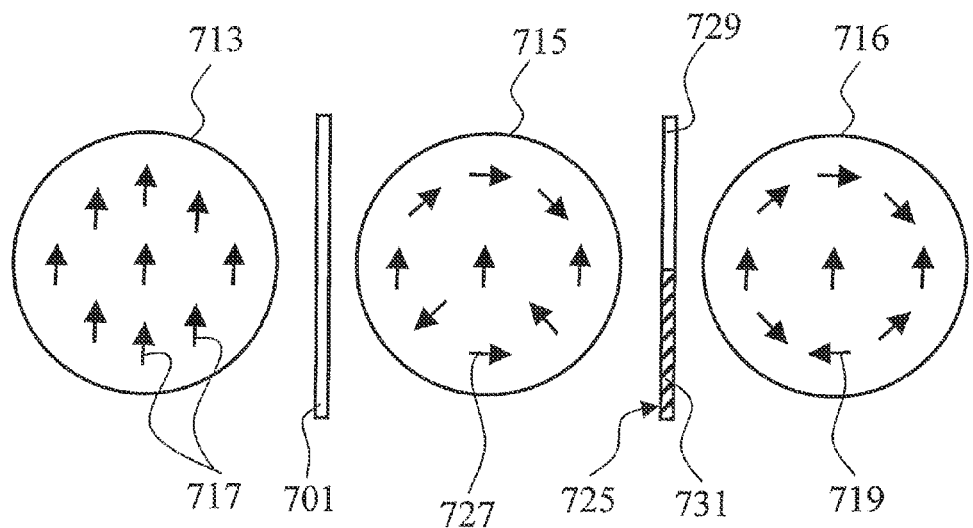
FIG. 7a schematically illustrates the polarization distribution of a bundle of light rays before and after passing through an optical arrangement with the polarization-modulating optical element with the thickness profile according to FIG. 4e and a planar-parallel plate, one half of which is configured as a half-wave plate.
Figure 7B:
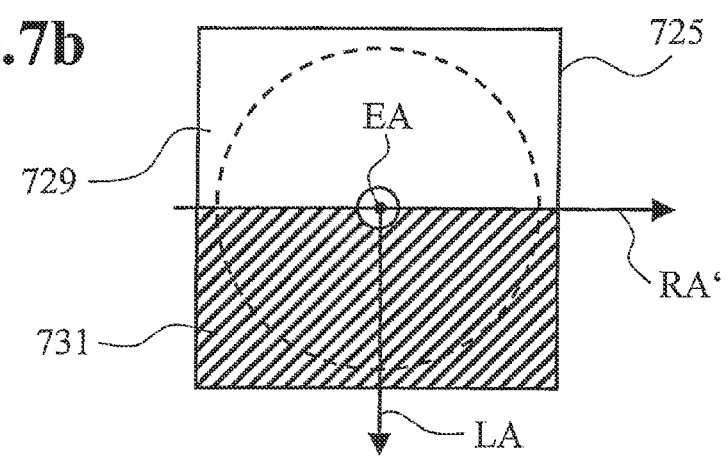
FIG. 7b shows a plan view of a planar-parallel plate, one half of which is configured as a half-wave plate.

A tangential polarization distribution can also be produced with a polarization-modulating optical element that has a thickness profile in accordance with FIG. 4e. The thickness profile in this embodiment of the invention has no discontinuities. As visualized in FIG. 7a, the uniformly oriented polarization distribution 717 of the entering light bundle 713 is first transformed by the polarization-modulating optical element 701 into a linear polarization distribution 727 of an exiting light bundle 715. The one-half of the entering light bundle 713 that passes through the polarization-modulating optical element 701 in the azimuth range 0≤θ≤180° of the thickness profile shown in FIG. 4e is converted so that the corresponding one-half of the exiting light bundle has a tangential polarization distribution. The other half, however, has a different, non-tangential polarization distribution 727. A further polarization-modulating optical element is needed in the light path in order to completely convert the polarization distribution 727 of the light bundle 715 exiting from the polarization-modulating optical element 701 into a tangential polarization distribution 719. The further polarization-modulating optical element is in this case configured as a planar-parallel plate 725 with a first half 729 and a second half 731. A plan view of the planar-parallel plate 725 is shown in FIG. 7b. The first half 729 is made of an isotropic material that has no effect on the state of polarization of a light ray, while the second half 731 is designed as a half-wave plate. The planar-parallel plate 725 in the optical arrangement of FIG. 7a is oriented so that a projection RA' of the reference axis RA of the polarization-modulating optical element 701 onto the planar-parallel plate runs substantially along the separation line between the first half 729 and the second half 731. The slow axis LA of the birefringence of the half-wave plate is perpendicular to this separation line. Alternatively tangential polarization can also be achieved with a polarization-modulating optical element, having a thickness profile as given by FIG. 4e, if the element is composed of two half wedge-shaped or helically shaped elements of crystalline quartz, wherein the optical activity of one element is clockwise and that of the other is counterclockwise. In this case no additional plane-parallel plate 725 is necessary, as it is in the embodiment of FIG. 7a. In this embodiment preferably each wedge-shaped element has a constant screw-slope, but the slopes have different directions as shown in the profile of FIG. 4e. Further, it is not necessary that the slopes of the geometrical thickness d have the same absolute values, it is sufficient if the slopes D of the optical effective thicknesses have the same absolute values. In this case the specific rotations α are different regarding absolute values for the two wedge-shaped elements which form the polarization-modulating optical element.

Figure 8:
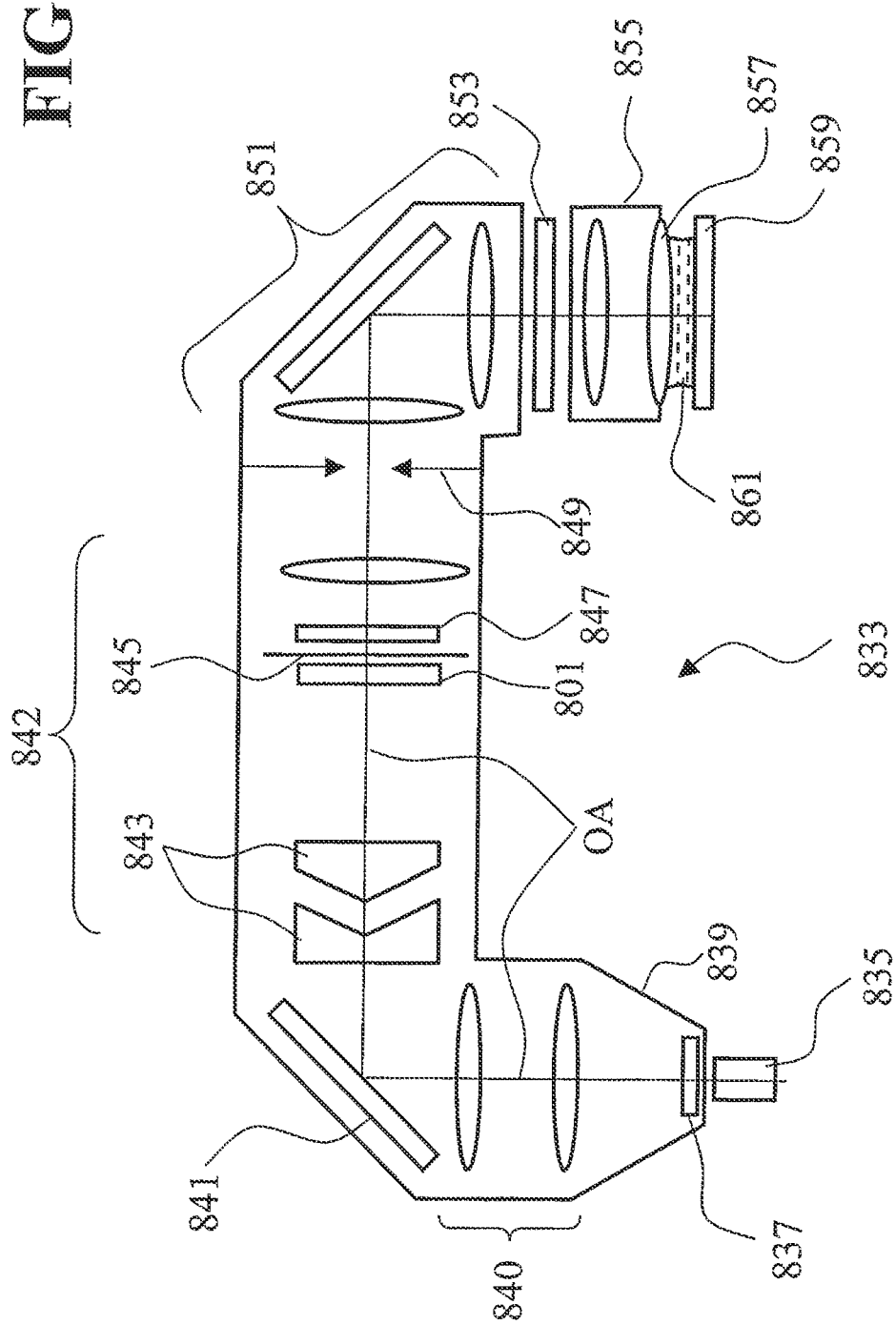
FIG. 8 schematically illustrates a microlithography projection system with a polarization-modulating optical element.

FIG. 8 schematically illustrates a microlithography projection system 833 which includes the light source unit 835, the illumination system 839, the mask 853 which carries a microstructure, the projection objective 855, and the substrate 859 that is being exposed to the projection. The light source unit 835 includes a DUV- or VUV-laser, for example an ArF laser for 192 nm, an $F_2$ laser for 157 nm, an $Ar_2$ laser for 126 nm or a $Ne_2$ laser for 109 nm, and a beam-shaping optical system which produces a parallel light bundle. The rays of the light bundle have a linear polarization distribution where the oscillation planes of the electrical field vectors of the individual light rays are oriented in a uniform direction. The principal configuration of the illumination system 839 is described in DE 195 29 563 (U.S. Pat. No. 6,258,433). The parallel light bundle falls on the divergence-increasing optical element 837. As a divergence-increasing optical element, one could use for example a raster plate with an arrangement of diffractive or refractive raster elements. Each raster element generates a light bundle whose angle distribution is determined by the dimension and focal length of the raster element. The raster plate is located in or near the object plane of an objective 840 that follows downstream in the light path. The objective 840 is a zoom objective which generates a parallel light bundle with a variable diameter. A direction-changing mirror 841 directs the parallel light bundle to an optical unit 842 which contains an axicon (i.e., a rotationally symmetric prism arrangement) 843. The zoom objective 840 in cooperation with the axicon 843 generates different illumination profiles in the pupil plane 845, depending on the setting of the zoom and the position of the axicon elements. A polarization-modulating optical element 801, for example of the kind shown in FIG. 3, is arranged in the pupil plane 845. The polarization-modulating optical element 801 is followed in the light path by a compensation plate 847 which has a thickness profile designed to compensate the angle deviations which the polarization-modulating optical element causes in the light rays that pass through it. The optical unit 842 is followed by a reticle-masking system (REMA) 849. The REMA Objective 851 projects an image of the reticle-masking system 849 onto the structure-carrying mask (reticle) 853, whereby the illuminated area of the reticle 853 is delimited. The projection objective 855 projects the image of the structure-carrying mask 853 onto the light-sensitive substrate 859. The space between the last optical element 857 of the projection objective and the light-sensitive substrate 859 contains an immersion liquid 861 with a refractive index different from air.

An additional advantage of the present invention is that polarization-modulating optical elements or the optical system according to the present invention can be used for adjusting the polarization distribution and also for temperature compensation of the polarization distribution in a microlithography projection system as described in FIG. 8. Advanced microlithography projection systems require in some applications a predefined polarization distribution at the reticle 853 with an accuracy of about 5° or even better, in some cases even better than 1°.

Since the polarization distribution at the reticle is influenced by the various optical elements by e.g. tension-induced birefringence, or by undefined or uncontrolled changes of the temperature of individual optical elements, the polarization distribution can unpredictably or uncontrollably change over time. To correct such changes the temperature dependency of the specific rotation α of the polarization-modulating optical element can be used to control the magnitude of the polarization angles. The optical system according to an embodiment of the present invention preferably comprises a polarization control system for controlling the polarization distribution of the light beam which is propagating through the optical system. The polarization distribution of interest is at a predefined location in the optical system. The polarization control system comprises at least one heating or cooling device to modify the temperature and/or the temperature distribution of the polarization-modulating optical element to affect the polarization distribution of the light beam at the predefined location. Here the polarization-modulating optical element may have a varying or constant effective optical thickness.

In the case of a constant effective optical thickness the optical system comprises an optical axis or a preferred direction given by the direction of a light beam propagating through the optical system. The optical system additionally comprises a polarization-modulating optical element described by coordinates of a coordinate system, wherein one preferred coordinate of the coordinate system is parallel to the optical axis or parallel to said preferred direction. The polarization-modulating optical element comprises solid and/or liquid optically active material, wherein the effective optical thickness is constant as a function of at least one coordinate different from the preferred coordinate of the coordinate system. The optical system comprises further a polarization control system for controlling the polarization distribution of the light beam (propagating through the optical system) at a predefined location in the optical system, and the polarization control system comprises at least one heating or cooling device to modify the temperature and/or the temperature distribution of the polarization-modulating optical element to affect the polarization distribution of the light beam at the predefined location.

Figure 9:
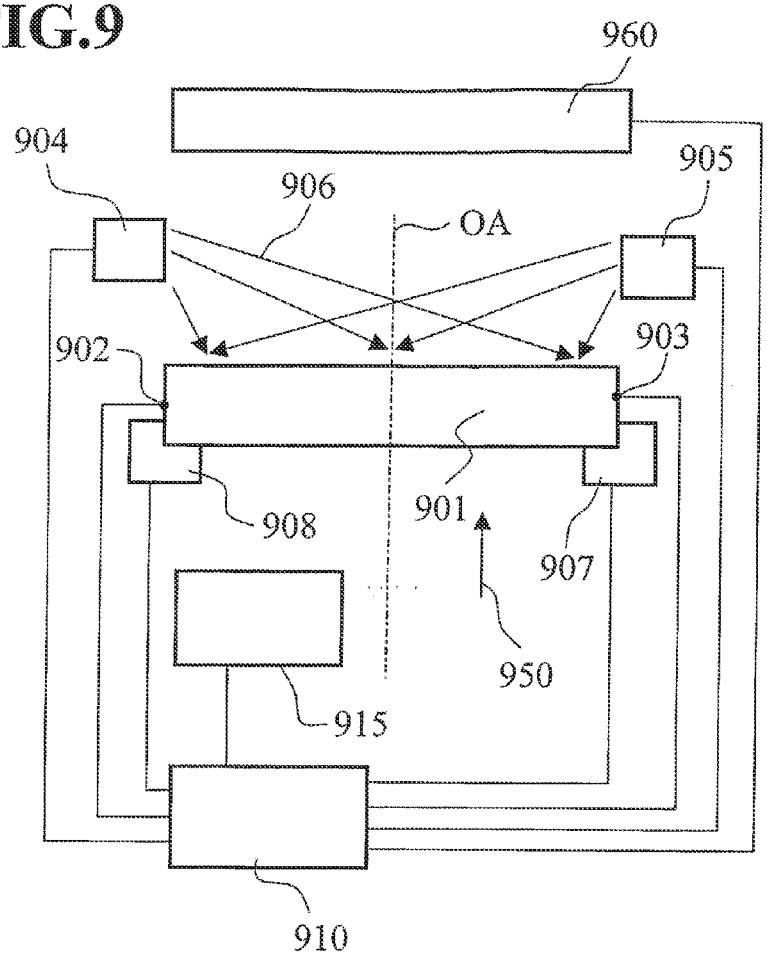
FIG. 9 schematically shows a parallel plane plate of optical active material used as a polarization-modulating element by adjusting its temperature and/or temperature profile.

As an example, if the polarization-modulating optical element (as used e.g. in the optical system according to the present invention) is made of synthetic (crystalline) quartz, comprising a parallel plate or formed as a parallel plate, a thickness of 10 mm of such a plate will result in a change of polarization of 23.6 mrad/° C. or 23.6 mrad/K, equivalent to 1.35°/K, due to the linear temperature coefficient $\gamma$ of the specific rotation $\alpha$ with $\gamma$=2.36 mrad/(mm*K). These data correspond to a wavelength of 193 nm. In such an embodiment, which is schematically shown in FIG. 9, the optical axis OA of the parallel plate 901 is directed parallel or approximately parallel to the propagation of the light (indicated by reference numeral 950) in the optical system. Approximately parallel means that the angle between the optical axis OA of the parallel plate 901 and the direction of the light propagating through the optical system is smaller than 200 mrad, preferably smaller than 100 mrad or even smaller than 50 mrad. Controlling the temperature of the plate 901 will result in a controlled change of polarization. If for example the temperature of the plate will be controlled in a range of about 20° C. to 40° C., the polarization angles can be controllably changed in a range of about ±13.5° for such a plate 901 made of quartz. This high sensitivity allows a control of the polarization distribution by temperature control. In such a case even a plane plate with a thickness d of about 0.1 mm up to 20 mm will become a polarization-modulating optical element 901, able to controllably adjust a polarization distribution by controlling the temperature of the plate 901. Preferably for synthetic (crystalline) quartz the thickness of the plate 901 is n*278.5 µm (n is any integer) which results in a rotation of a polarization plane of at least 90° for n=1 and 180° for n=2 and in general n*90°, for a wavelength of 193 nm at about 21.6° C. For a 90° rotation of the polarization plane the synthetic quartz should be at least 278.5 µm thick and for 180° at least 557.1 µm, for 270° the thickness should be 835.5 µm and for a 360° rotation of the polarization the thickness is 1.114 mm. The manufacturing tolerances regarding thickness are about ±2 µm. Thus the manufacturing tolerance results in an inaccuracy of the angle of the polarization plane of the light which passes the plate of about ±0.64° at about 21.6° C. and 193 nm. To this inaccuracy an additional inaccuracy caused by temperature fluctuation of the plate (or polarization-modulating optical element) have to be considered, which is given by the linear temperature coefficient $\gamma$ of the specific rotation $\alpha$ with is $\gamma$=2.36 mrad/(mm*K)=0.15°/(mm*K).

The temperature control of the plate 901 can be done by closed-loop or open-loop control, using a temperature sensing device with at least one temperature sensor 902, 903 for determining the temperature of the plate 901 (or providing a temperature sensor value which is representative or equal to the temperature and/or the temperature distribution of the polarization-modulating optical element), at least a heater 904, 905, preferably comprising an infrared heater, for heating the plate by infrared radiation 906, and a control circuit 910 for controlling the at least one heater 904, 905. As an example of a temperature sensing device a infrared sensitive CCD-element with a projection optics may be used, wherein the projection optics images at least a part of the plate 901 onto the CCD-element such that a temperature profile of the viewed part of the plate 901 can be determined by the analysis of the CCD-element signals. The control circuit 910 may comprise a computer system 915 or may be connected to the computer or control system 915 of the microlithography projection system 833 (see FIG. 8). In a preferred embodiment of the temperature controlled plate 901 the thickness is chosen such that a rotation of the polarization of n*90°, n is any integer number, is achieved at a temperature T=$(T_{max}-T_{min})$/ 2+$T_{min}$, whereas $T_{max}$ and $T_{min}$ are the maximum and minimum temperatures of the plate 901 (or in general the polarization-manipulating optical element). Preferably the heater or heating system (and also any cooling device like a Peltier element) is arranged such that it is not in the optical path of the microlithography projection system 833, or that it is not in the optical path of the light beam which is propagating through the optical system according to an embodiment of the present invention. Preferably the optical system with the polarization control system according to the present invention is used in a system with at least one additional optical element arranged between the polarization-modulating optical element and the predefined location in the optical system such that the light beam contacts the at least one additional optical element when propagating from the polarization-modulating optical element to the predefined location. The additional optical element preferably comprises a lens, a prism, a mirror, a refractive or a diffractive optical element or an optical element comprising linear birefringent material. Thus the optical system according to the present invention may form a part of a microlithography projection system 833.

In a further preferred embodiment the temperature of the polarization-manipulating optical element 901 (the plate as shown in FIG. 9) corresponds to a predefined temperature profile. As an example, such a temperature profile is achieved by using a plurality of infrared heaters 904, 905 to produce a radiation distribution across the optical element 901 which heats the optical element 901 in a controlled way with a control circuit as already described. In such an embodiment also a plurality of temperature sensors 902, 903 can be used for the control circuit 910. With this embodiment the polarization state in a field plane or pupil plane of the microlithography projection system 833 can be adjusted locally.

Alternatively or in addition the heater or heating elements 904, 905 may be replaced or supplemented by one or more Peltier-elements 907, 908. The Peltier-element or elements are preferably connected to the control circuit 910 such that a control by open and/or closed loop control is possible. The advantage of the Peltier-elements is that also a controlled cooling of the polarization-manipulating optical element 901 can be achieved. Heating and cooling the optical element 901 at the same time result in complex temperature distributions in the polarization-modulating optical element 901, which result in complex polarization distributions of the light 950 propagating e.g. through the microlithography projection system 833, after passing the element 901. Of course, other heating and cooling means than the ones mentioned above can be used to achieve a required temperature profile or a required temperature of the polarization-modulating optical element 901.

The application of the plane plate 901 as polarization-modulating optical element 801 in the illumination system of a microlithography projection apparatus 833 (see FIG. 8) is preferably in the pupil plane 845 and/or at positions between the light source unit 835 and the mentioned pupil plane 845. Applying the plane plate 901 at these locations has the advantage that the angle of incidence of the light which passes through the plate 901 and also passing through the microlithography projection apparatus is smaller than about 6° (100 mrad). At these small angles the influence of linear birefringence, caused by the plate 901, is very small such that the polarization of the light after passing the plate 901 is almost liner with negligible elliptical parts, if the light was linearly polarized before entering the plate 901.

In a further preferred embodiment of the invention the state of the polarization of the light passed through the polarization-modulating element 901 or the optical system according to the present invention is measured. For this the polarization control system comprises a polarization measuring device providing a polarization value representative for or equal to the polarization or the polarization distribution of the light beam at the predetermined location in the optical system. Further, the control circuit controls the at least one heating or cooling device dependent on the temperature sensor value and/or the polarization value by open or closed loop control. The measured state of polarization is compared with a required state and in the case that the measured state deviates more than a tolerable value, the temperature and/or the temperature distribution of the polarizing-modulating element like the plane plate 901 is changed such that the difference between the measured and the required state of polarization becomes smaller, and if possible such small that the difference is within a tolerable value. In FIG. 9 the measurement of the state of polarization is measured in-situ or with a separate special measurement, depending on the polarization measuring device 960. The polarization measuring device may be connected with the control circuit 910, such that depending on the measured polarization state values the heating means 904, 905 and/or 907, 908 are controlled heated and/or cooled such that the measured and the required state of polarization becomes smaller. The control can be done in open or closed loop modus.

The plane plate 901 used as polarization-modulating optical element or being a part of such element is especially appropriate to correct orientations of polarization states of the passed light bundles.

Figure 10:
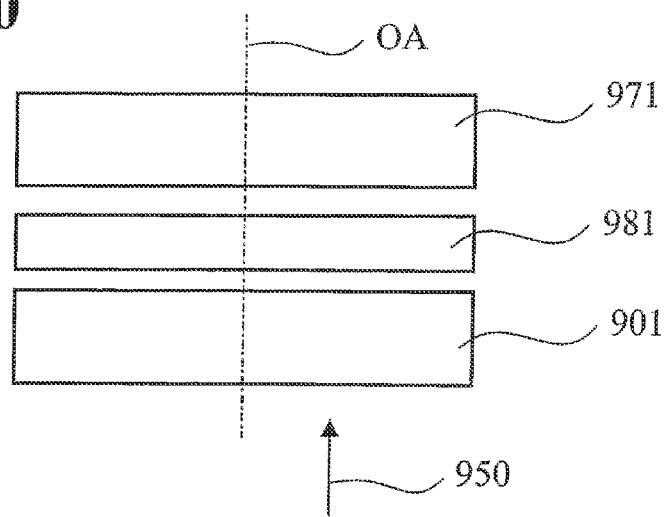
FIG. 10 shows a combination of a parallel plate of optical active material with a plate made of birefringent material.

In a further embodiment of the present invention the plane plate 901 (comprising or consisting of optically active material), used as a polarization-modulating optical element, is combined with a plate 971 (see FIG. 10), comprising or consisting of linear birefringent material. With this embodiment of the invention the orientation and the phase of the passing light bundle 950 can be subjected such that e.g. a plane polarized light bundle becomes elliptically polarized after passing both plane plates 901 and 971, or vice versa. In this embodiment at least one plate 901 or 971 is controlled regarding its temperature and/or temperature distribution as described in connection with FIG. 9. Further, the sequence of the plates 901 and 971 may be changed such that the passing light bundles are first passing through the plate 971, comprising or consisting of linear birefringent material, and than through the plate 901, comprising or consisting of optical active material, or vice versa. Preferably both plates are consecutively arranged along the optical axis OA of the system. Also, more than one plate comprising or consisting of linear birefringent material, and/or more than one plate comprising or consisting of optical active material may be used to manipulate the state of polarization of the passing light bundles. Further, a plane plate 971, or 901 may be exchanged by a liquid cell or cuvette containing optically active material. Also the plane plates 971, comprising or consisting of linear birefringent material, and plate 901, comprising or consisting of optical active material, can be arranged such that at least one other optical element 981 is placed between these plane plates. This element 981 can be for example a lens, a diffractive or refractive optical element, a mirror or an additional plane plate.

In an additional embodiment of the present invention a polarization-modulating element or in general a polarizing optical element is temperature compensated to reduce any inaccuracy of the polarization distribution generated by the polarization-modulating element due to temperature fluctuations of said element, which for synthetic quartz material is given by the linear temperature coefficient $\gamma$ of the specific rotation $\alpha$ for quartz (which is as already mentioned above $\gamma=2.36$ mrad/(mm*K)=0.15°/(mm*K)). The temperature compensation makes use of the realization that for synthetic quartz there exist one quartz material with a clockwise and one quartz material with a counterclockwise optical activity (R-quartz and L-quartz). Both, the clockwise and the counterclockwise optical activities are almost equal in magnitude regarding the respective specific rotations $\alpha$. The difference of the specific rotations is less than 0.3%. Whether the synthetic quartz has clockwise (R-quartz) or counterclockwise (L-quartz) optical activity dependents on the seed-crystal which is used in the manufacturing process of the synthetic quartz.

R- and L-quartz can be combined for producing a thermal or temperature compensated polarization-modulating optical element 911 as shown in FIG. 11. Regarding the change of the state of polarization such a temperature compensated polarization-modulating optical element 911 is equivalent to a plane plate of synthetic quartz of thickness d. For example, two plane plates 921 and 931 are arranged behind each other in the direction 950 of the light which is propagating through the optical system which comprises the temperature compensated polarization-modulating optical element 911. The arrangement of the plates is such that one plate 931 is made of R-quartz with thickness $d_R$, and the other 921 is made of L-quartz with thickness $d_L$, and $|d_R-d_L|=d$. If the smaller thickness of $d_R$ and $d_L$ ($\min(d_R, d_L)$) is larger than d or $\min(d_R, d_L)>d$, which in most cases is a requirement due to mechanical stability of the optical element, then the temperature dependence of the polarization state becomes partly compensated, meaning that the temperature dependence of the system of R-quartz and L-quartz plates is smaller than $\gamma=2.36$ mrad/(mm*K)*d=0.15°/(mm*K)*d, wherein d is the absolute value of the difference of the thicknesses of the two plates $d=|d_R-d_L|$. The following example demonstrates this effect. A R-quartz plate 931 with a thickness of e.g. $d_R=557.1$ µm (resulting in a 180° clockwise change of the exiting polarization plane compared to the incident polarization plane) is combined with a L-quartz plate 921 with a thickness of $d_L=557.1$ µm+287.5 µm (resulting in a 270° counterclockwise change of the exiting polarization plane compared to the incident polarization). This result in a 90° counterclockwise change of the polarization plane after the light pass both plane plates 921, 931, corresponding to a 270° clockwise change of the polarization plane if just a R-quartz plate would be used. In this case the temperature compensation is not fully achieved, but it is reduced to value of about 0.04°/K if both plates are used, compared to 0.13°/K if just a R-quartz plate of $d_R=557.1$ µm+287.5 µm would be used. This is a significant reduction of temperature dependency, since even if the temperature will change by 10° C. the change of the polarization plane is still smaller than 1°.

In general any structured polarization-modulating optical element made of R- or L-quartz, like e.g. the elements as described in connection with FIGS. 3 and 4a can be combined with a plane plate of the respective other quartz type (L- or R-quartz) such that the combined system 911 will have a reduced temperature dependence regarding the change of the polarization. Instead of the plane plate also a structured optical element made of the respective other quartz type may be used such that in FIG. 11 the shown plates 921 and 931 can be structured polarization-modulating optical elements as mentioned in this specification, having specific rotations of opposite signs, changing the state of polarization clockwise and counterclockwise.

To generalize the above example of a temperature compensated polarization-modulating optical element 911, the present invention also relates to an optical system comprising an optical axis OA or a preferred direction 950 given by the direction of a light beam propagating through the optical system. The optical system comprising a temperature compensated polarization-modulating optical element 911 described by coordinates of a coordinate system, wherein one preferred coordinate of the coordinate system is parallel to the optical axis OA or parallel to said preferred direction 950. The temperature compensated polarization-modulating optical element 911 comprises a first 921 and a second 931 polarization-modulating optical element. The first and/or the second polarization-modulating optical element comprising solid and/or liquid optically active material and a profile of effective optical thickness, wherein the effective optical thickness varies at least as a function of one coordinate different from the preferred coordinate of the coordinate system. In addition or alternative the first 921 and/or the second 931 polarization-modulating optical element comprises solid and/or liquid optically active material, wherein the effective optical thickness is constant as a function of at least one coordinate different from the preferred coordinate of the coordinate system. As an additional feature, the first and the second polarization-modulating optical elements 921, 931 comprise optically active materials with specific rotations of opposite signs, or the first polarization-modulating optical element comprises optically active material with a specific rotation of opposite sign compared to the optically active material of the second polarization-modulating optical element. In the case of plane plates, preferably the absolute value of the difference of the first and the second thickness of the first and second plate is smaller than the thickness of the smaller plate.

In an additional embodiment of the present invention a polarization-modulating element comprises an optically active and/or optically inactive material component subjected to a magnetic field such that there is a field component of the magnetic field along the direction of the propagation of the light beam through the polarization-modulating element. The optical active material component may be construed as described above. However, also optical inactive materials can be used, having the same or similar structures as described in connection with the optical active materials. The application of a magnetic field will also change the polarization state of the light passing through the optical active and/or optical inactive material due to the Faraday-effect, and the polarization state can be controlled by the magnetic field.

Various embodiments for a polarization-modulating optical element or for the optical systems according to the present invention are described in this application. Further, also additional embodiments of polarization-modulating optical elements or optical systems according to the present invention may be obtained by exchanging and/or combining individual features and/or characteristics of the individual embodiments described in the present application.

The invention claimed is:

1. A method of producing a polarization-modulating element that modulates a polarization state of incident light into a predetermined polarization state, the polarization-modulating element being used with an illumination optical apparatus, the method comprising:
   preparing an optical material having optical activity; and
   providing the optical material with a circumferentially varying thickness profile and a central region that is an aperture having no optical activity,
   wherein the optical material rotates a plane of oscillation of linearly polarized light traveling through the optical material along a crystallographic axis of the optical material by an angle with a magnitude proportional to a distance travelled by the linearly polarized light inside the optical material, and the thickness profile is set so that light in a linearly polarized state having a direction of polarization substantially along a single direction, is transformed into light in an azimuthal polarization state having a direction of polarization substantially along a circumferential direction or into light in a radially polarized state having a direction of polarization substantially along the radial direction.

2. The production method of the polarization-modulating element according to claim 1, wherein the step of providing the circumferentially varying thickness profile provides a thickness profile such that thicknesses of two arbitrary regions adjacent to each other among a plurality of circumferentially separated regions are different from each other.

3. The production method of the polarization-modulating element according to claim 2, wherein two arbitrary regions opposite to each other among the plurality of regions have their respective angles of optical rotation substantially equal to each other.

4. The production method of the polarization-modulating element according to claim 1, wherein the step of providing the circumferentially varying thickness profile provides a thickness profile circumferentially varying in a substantially continuous manner.

5. The production method of the polarization-modulating element according to claim 1, wherein the step of preparing the optical material having optical activity sets the optical material so that the crystallographic axis thereof coincides with a traveling direction of the incident light.

6. The production method of the polarization-modulating element according to claim 5, wherein the step of providing the circumferentially varying thickness profile provides a thickness profile such that thicknesses of two arbitrary regions adjacent to each other among a plurality of circumferentially separated regions are different from each other.

7. The production method of the polarization-modulating element according to claim 6, wherein two arbitrary regions opposite to each other among the plurality of regions have their respective angles of optical rotation substantially equal to each other.

8. The production method of the polarization-modulating element according to claim 1, wherein the illumination optical apparatus has an optical integrator.

9. The production method of the polarization-modulating element according to claim 8, wherein the step of providing the circumferentially varying thickness profile provides a thickness profile circumferentially varying in a substantially continuous manner.

10. The production method of the polarization-modulating element according to claim 8, wherein the step of preparing the optical material having optical activity sets the optical material so that the crystallographic axis thereof coincides with a traveling direction of the incident light.

11. The production method of the polarization-modulating element according to claim 1, wherein the illumination optical apparatus has a raster plate.

12. The production method of the polarization-modulating element according to claim 11, wherein the step of providing the circumferentially varying thickness profile provides a thickness profile such that thicknesses of two arbitrary regions adjacent to each other among a plurality of circumferentially separated regions are different from each other.

13. The production method of the polarization-modulating element according to claim 12, wherein two arbitrary regions opposite to each other among the plurality of regions have their respective angles of optical rotation substantially equal to each other.

14. The production method of the polarization-modulating element according to claim 11, wherein the step of providing the circumferentially varying thickness profile provides a thickness profile circumferentially varying in a substantially continuous manner.

15. The production method of the polarization-modulating element according to claim 11, wherein the step of preparing the optical material having optical activity sets the optical material so that the crystallographic axis thereof coincides with a traveling direction of the incident light.

* * * * *

UNITED STATES PATENT AND TRADEMARK OFFICE
CERTIFICATE OF CORRECTION

PATENT NO. : 9,316,772 B2  
APPLICATION NO. : 14/108428  
DATED : April 19, 2016  
INVENTOR(S) : Damian Fiolka and Markus Deguenther Page 1 of 1

It is certified that error appears in the above-identified patent and that said Letters Patent is hereby corrected as shown below:

In the Specification

Column 5

Line 54, delete "drain" and insert -- $d_{min}$ --

Line 62, delete "90°/a" and insert -- 90°/α --

Column 6

Line 15 (Approx.), after "obscuration" insert -- . --

Column 9

Line 7, delete "a" and insert -- α --

Column 12

Line 55, delete "cafl" and insert -- can --

Line 61, delete "a" and insert -- α --

Column 14

Line 65, delete "from," and insert -- from --

Column 16

Line 11, delete "135°/a" and insert -- 135°/α --

Column 19

Line 8, delete "7" and insert -- γ --

Column 21

Line 44, delete "than" and insert -- then --

Signed and Sealed this  
Second Day of August, 2016

Michelle K. Lee  
*Director of the United States Patent and Trademark Office*